US008815491B2

(12) United States Patent
Masunaga et al.

(10) Patent No.: US 8,815,491 B2
(45) Date of Patent: Aug. 26, 2014

(54) CHEMICALLY AMPLIFIED NEGATIVE RESIST COMPOSITION AND PATTERNING PROCESS

(75) Inventors: Keiichi Masunaga, Joetsu (JP); Daisuke Domon, Joetsu (JP); Satoshi Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 135 days.

(21) Appl. No.: 13/407,325

(22) Filed: Feb. 28, 2012

(65) Prior Publication Data
US 2012/0219888 A1  Aug. 30, 2012

(30) Foreign Application Priority Data

Feb. 28, 2011  (JP) ................................. 2011-041517

(51) Int. Cl.
G03F 7/004 (2006.01)
G03F 7/027 (2006.01)

(52) U.S. Cl.
USPC .......................... 430/270.1; 430/913; 430/927

(58) Field of Classification Search
USPC .............................................. 430/270.1, 913
See application file for complete search history.

(56) References Cited

U.S. PATENT DOCUMENTS

| | | | |
|---|---|---|---|
| 4,111,877 A * | 9/1978 | Dixon et al. ................... | 524/809 |
| 5,945,250 A | 8/1999 | Aoai et al. | |
| 6,746,817 B2 | 6/2004 | Takeda et al. | |
| 7,897,821 B2 | 3/2011 | Nagai et al. | |
| 7,932,334 B2 | 4/2011 | Ando et al. | |
| 7,977,027 B2 | 7/2011 | Takeda et al. | |
| 8,057,892 B2 * | 11/2011 | Yang et al. .................... | 428/323 |
| 8,071,676 B2 * | 12/2011 | Matsuda et al. ............... | 524/572 |
| 8,105,748 B2 | 1/2012 | Ohashi et al. | |
| 8,361,693 B2 * | 1/2013 | Masunaga et al. ......... | 430/270.1 |
| 8,470,511 B2 * | 6/2013 | Masunaga et al. ......... | 430/270.1 |
| 8,470,512 B2 * | 6/2013 | Masunaga et al. ......... | 430/270.1 |
| 8,507,173 B2 * | 8/2013 | Hatakeyama et al. ..... | 430/270.1 |
| 2006/0166133 A1 | 7/2006 | Koitabashi et al. | |
| 2008/0020290 A1 * | 1/2008 | Hatakeyama et al. ............. | 430/4 |
| 2008/0102407 A1 | 5/2008 | Ohsawa et al. | |
| 2008/0241751 A1 * | 10/2008 | Takeda et al. ............... | 430/286.1 |
| 2008/0305411 A1 | 12/2008 | Koitabashi et al. | |
| 2010/0009299 A1 | 1/2010 | Watanabe et al. | |
| 2010/0143830 A1 * | 6/2010 | Ohashi et al. ..................... | 430/5 |
| 2011/0143266 A1 * | 6/2011 | Tanaka et al. ..................... | 430/5 |
| 2012/0028190 A1 * | 2/2012 | Masunaga et al. ......... | 430/285.1 |
| 2012/0219887 A1 * | 8/2012 | Masunaga et al. ................. | 430/5 |

FOREIGN PATENT DOCUMENTS

| | | |
|---|---|---|
| EP | 1 684 118 A1 | 7/2006 |
| EP | 1 975 711 A1 | 10/2008 |
| EP | 2 362 267 A1 | 8/2011 |
| EP | 2 412 733 A1 | 2/2012 |
| JP | 8-041150 A | 2/1996 |
| JP | 9-325497 A | 12/1997 |
| JP | 2002-202610 A | 7/2002 |
| JP | 2002-244297 A | 8/2002 |
| JP | 2006-201532 A | 8/2006 |
| JP | 2006-215180 A | 8/2006 |
| JP | 2007-197718 A | 8/2007 |
| JP | 2007-328060 A | 12/2007 |
| JP | 2008-102383 A | 5/2008 |
| JP | 2008197606 A * | 8/2008 |
| JP | 2008-249762 A | 10/2008 |
| JP | 2008-249951 A | 10/2008 |
| JP | 2008-304590 A | 12/2008 |
| JP | 2010-116550 A | 5/2010 |
| JP | 2010-164933 A | 7/2010 |
| JP | 2011237477 A * | 11/2011 |
| WO | 2006/121096 A1 | 11/2006 |

OTHER PUBLICATIONS

Machine translation of JP 2008-249951 (no date).*
Machine translation of JP 2008-197606 (no date).*
Japanese Office Action dated Apr. 30, 2013, issued in corresponding Japanese Patent Application No. 2011-041517.
Extended European Search Report dated Aug. 20, 2013, issued in European Patent Application No. 12157259.8.

* cited by examiner

*Primary Examiner* — Amanda C. Walke
(74) *Attorney, Agent, or Firm* — Westerman, Hattori, Daniels & Adrian, LLP

(57) ABSTRACT

A polymer comprising 0.5-10 mol % of recurring units having acid generating capability and 50-99.5 mol % of recurring units providing for dissolution in alkaline developer is used to formulate a chemically amplified negative resist composition. When used in a lithography process, the composition exhibits a high resolution and forms a negative resist pattern of a profile with minimized LER and undercut.

4 Claims, No Drawings

CHEMICALLY AMPLIFIED NEGATIVE RESIST COMPOSITION AND PATTERNING PROCESS

CROSS-REFERENCE TO RELATED APPLICATION

This non-provisional application claims priority under 35 U.S.C. §119(a) on Patent Application No. 2011-041517 filed in Japan on Feb. 28, 2011, the entire contents of which are hereby incorporated by reference.

TECHNICAL FIELD

This invention relates to a chemically amplified negative resist composition comprising a polymer having an acid generating capability, typically for use in processing of semiconductor and photomask substrates, and a patterning process using the same.

BACKGROUND ART

In the recent drive for higher integration and operating speeds in LSI devices, it is desired to miniaturize the pattern rule. The exposure process and the resist composition are largely altered to meet such a demand. Particularly when resist patterns with a feature size of 0.2 µm or less are formed by lithography, KrF and ArF excimer laser radiation, electron beam (EB) or the like is used as the energy source for exposure, and chemically amplified resist compositions having a high sensitivity to such high-energy radiation and affording a high resolution are used as the photoresist.

Resist compositions include positive ones in which exposed areas are dissolved away and negative ones in which exposed areas are left as a pattern. A suitable composition is selected among them depending on the desired resist pattern. In general, the chemically amplified negative resist composition comprises a polymer which is normally soluble in an aqueous alkaline developer, an acid generator which is decomposed to generate an acid upon exposure to light, and a crosslinker which causes the polymer to crosslink in the presence of the acid serving as a catalyst, thus rendering the polymer insoluble in the developer (sometimes, the crosslinker is incorporated in the polymer). Typically a basic compound is added for controlling the diffusion of the acid generated upon light exposure.

A number of negative resist compositions of the type comprising a polymer which is soluble in an aqueous alkaline developer and includes phenolic units as the alkali-soluble units were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the EB and EUV lithography capable of forming finer size patterns. Exemplary compositions are described in Patent Documents 1 to 3.

In the course of development of resist compositions as mentioned above, the resist compositions are required to exhibit not only a high resolution which is the fundamental function of a resist film, but also high etch resistance. This is because the resist film must be thinned as the pattern feature size is reduced. One known means for achieving such high etch resistance is by introducing a polycyclic compound containing aromatic ring and non-aromatic ring wherein the non-aromatic ring has a carbon-carbon double bond conjugated to the aromatic ring, like indene or acenaphthylene, into a hydroxystyrene-based polymer as an auxiliary component. Examples are described in Patent Documents 1 to 3. Units having phenolic hydroxyl group are disclosed in Patent Documents 4 and 5.

On the other hand, the chemically amplified resist composition typically contains a compound which is decomposed to generate an acid upon exposure to high-energy radiation, known as acid generator, the acid serving as the catalyst for changing the solubility of the polymer in developer. A number of acid generators have been developed. In the immersion lithography, one effective technique of preventing the acid generator from being leached out into the immersion medium is by incorporating the acid generator into a polymer as one of recurring units. While this technique was applied to the positive resist composition, it was found effective for improving line edge roughness (LER) (see Patent Documents 6 and 7).

CITATION LIST

Patent Document 1: JP-A 2006-201532 (US 20060166133, EP 1684118)
Patent Document 2: JP-A 2006-215180
Patent Document 3: JP-A 2008-249762 (US 2008241751, EP 1975711)
Patent Document 4: JP-A 2002-202610
Patent Document 5: JP-A 2002-244297
Patent Document 6: JP-A H09-325497
Patent Document 7: JP-A 2010-116550
Patent Document 8: JP-A 2007-197718
Patent Document 9: JP-A 2007-328060
Patent Document 10: WO 2006/121096
Patent Document 11: JP-A H08-041150
Patent Document 12: JP-A 2008-304590

DISCLOSURE OF INVENTION

In principle, the polymer-bound acid generator mentioned above can be applied to the negative resist composition. The recurring unit having acid generator incorporated therein is neutral and highly fat soluble prior to exposure, due to the physical properties inherent to its structure. Upon receipt of high-energy radiation, the recurring unit is decomposed, whereby the polymer changes to be strongly acidic and highly water soluble. When the polymer is developed with an alkaline developer, the polarity change of the polymer having acid generator incorporated therein works advantageously for positive pattern formation, but rather disadvantageously for negative pattern formation. Thus, when a resist composition with higher resolution is desired, the technique of incorporating an acid generator into a polymer is not affirmatively applied to the negative resist composition.

Accordingly, an object of the invention is to provide a chemically amplified negative resist composition comprising a polymer having an acid generator incorporated therein and offering advantages such as high resolution and minimal LER, and a resist pattern forming process using the same.

In an attempt to apply a polymer having an acid generator incorporated therein to a negative resist composition, the inventors have found that a fine feature size pattern is formed with a likelihood of forming bridges between features and leaving scum in spaces. However, the inventors have found that when an acid generator unit of a specific structure and another recurring unit are combined in a specific range, a high resolution is obtainable despite a disadvantageous propensity of dissolution contrast and the LER reducing effect as intended is obtainable at the same time. Quite unexpectedly, even on a substrate which is prone to cause undercutting, a pattern can be formed to a profile with controlled undercut.

In one aspect, the invention provides a chemically amplified negative resist composition comprising a polymer, adapted such that the polymer may turn insoluble in alkaline developer by reacting with a crosslinker and/or a recurring unit having a crosslinkable functional group in the polymer under the catalysis of an acid generated upon exposure to high-energy radiation, to form crosslinks between polymer molecules. The polymer comprises recurring units of the general formula (1) and recurring units of at least one type selected from the general formulae (2), (3), and (4).

is independently 0 or 1, and t is an integer of 0 to 2. The recurring units of formula (1) account for 0.5 to 10 mol % and the sum of recurring units of formulae (2), (3), and (4) accounts for 50 to 99.5 mol %, based on the entire recurring units of the polymer.

In a preferred embodiment, the polymer further comprises recurring units of at least one type selected from the general formulae (5), (6), and (7).

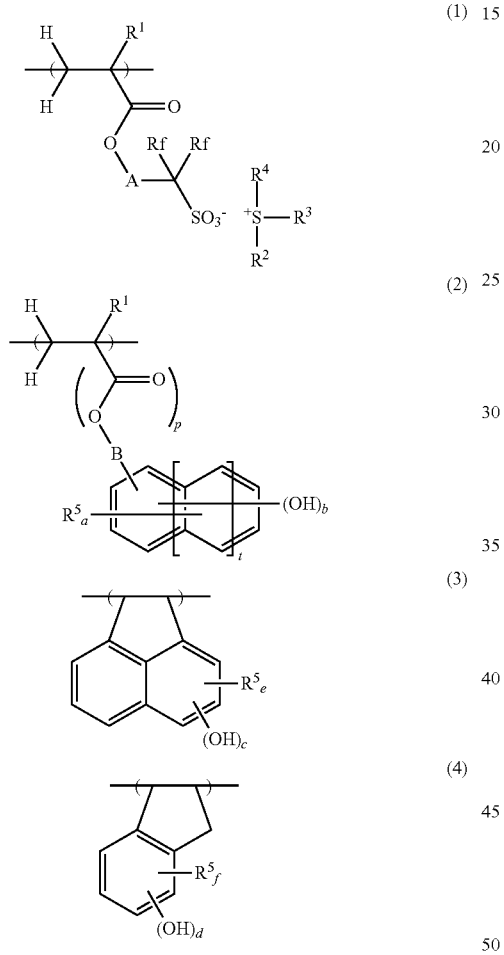

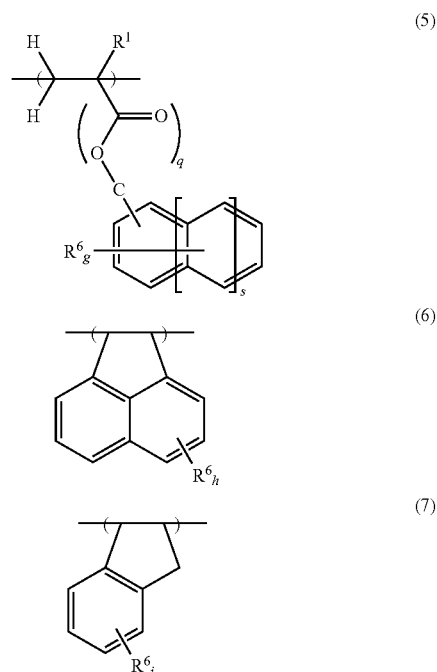

Herein A is a $C_1$-$C_{10}$ divalent hydrocarbon group in which some or all hydrogen atoms may be replaced by fluorine or a methylene moiety may be replaced by oxygen; Rf is each independently hydrogen, fluorine, trifluoromethyl, or pentafluoroethyl, with the proviso that not all Rf's are hydrogen; B is a single bond or a $C_1$-$C_{10}$ alkylene group which may be separated by ethereal oxygen; $R^1$ is hydrogen, fluorine, methyl, or trifluoromethyl; $R^2$, $R^3$, and $R^4$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, any two or more of $R^2$, $R^3$, and $R^4$, taken together, may be a divalent organic group to form a ring with the sulfur atom; $R^5$ is each independently a $C_1$-$C_6$ alkyl group; a is an integer of 0 to 4, b is an integer of 1 to 5, c and d each are an integer of 1 to 4, e is an integer of 0 to (4-c), f is an integer of 0 to (4-d), p Herein C is a single bond or a $C_1$-$C_{10}$ alkylene group which may be separated by ethereal oxygen, $R^1$ is as defined above, $R^6$ is each independently halogen, an optionally halo-substituted $C_1$-$C_8$ alkyl or alkoxy group, a $C_6$-$C_{20}$ aromatic ring-containing hydrocarbon group, or an optionally halo-substituted $C_1$-$C_1$, acyloxy group, g is an integer of 0 to 5, h and i each are an integer of 0 to 4, q is 0 or 1, and s is an integer of 0 to 2.

In a preferred embodiment, the polymer further comprises recurring units of the general formula (M-1) or (M-2).

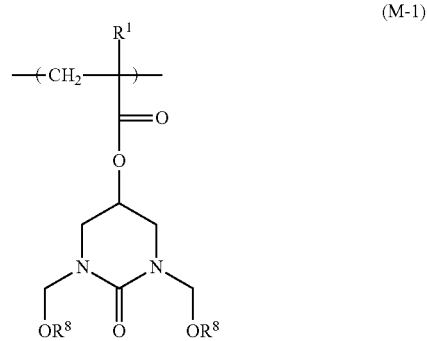

-continued (M-2)

$$\begin{CD} -\!\!\!-\!\!(CH_2\!-\!\overset{R^1}{\underset{}{C}})\!\!-\!\!\!- \end{CD}$$

[structure showing naphthalene with R⁹ₑ substituent, ester linkage to a ring containing N-N with two OR⁸ groups and carbonyl]

Herein R¹ is as defined above, R⁸ is hydrogen or a straight, branched or cyclic $C_1$-$C_6$ monovalent hydrocarbon group, R⁹ is each independently a straight, branched or cyclic $C_1$-$C_6$ monovalent hydrocarbon group which may contain oxygen, or halogen, e is an integer of 0 to 4, and u is an integer of 0 to 2.

The resist composition may further comprise a polymer free of recurring units of formula (1) and a basic compound. The crosslinker is typically an alkoxymethylglycoluril or alkoxymethylmelamine.

In another aspect, the invention provides a pattern forming process comprising the steps of applying the negative resist composition defined above onto a processable substrate to form a resist film, exposing the film patternwise to high-energy radiation, and developing the exposed film with an alkaline developer to form a resist pattern.

In a preferred embodiment, the high-energy radiation is EUV or EB. In another preferred embodiment, the processable substrate is a photomask blank. A typical photomask blank comprises a chromium-containing material at the outermost surface.

Advantageous Effects of Invention

A polymer comprising recurring units having acid generating capability represented by formula (1) and recurring units providing for dissolution in alkaline developer represented by formulae (2) to (4) in a specific range is used to formulate a chemically amplified negative resist composition having a high resolution. When the composition is used in a lithography process of forming a negative resist pattern which is required to have an ultrafine size, the pattern can be formed to a profile which is improved in LER and reduced in the degree of undercut which is otherwise inherent to the negative resist composition.

DESCRIPTION OF EMBODIMENTS

As used herein, the singular forms "a," "an" and "the" include plural referents unless the context clearly dictates otherwise.

"Optional" or "optionally" means that the subsequently described event or circumstances may or may not occur, and that description includes instances where the event or circumstance occurs and instances where it does not.

The notation ($C_n$-$C_m$) means a group containing from n to m carbon atoms per group.

The abbreviations and acronyms have the following meaning.

UV: ultraviolet
DUV: deep ultraviolet
EUV: extreme ultraviolet
EB: electron beam
Mw: weight average molecular weight
Mn: number average molecular weight
Mw/Mn: molecular weight distribution or dispersity
GPC: gel permeation chromatography
PEB: post-exposure baking
PAG: photoacid generator
LER: line edge roughness The invention is directed to a chemically amplified negative resist composition comprising a polymer, adapted to turn insoluble in alkaline developer through the mechanism that an electrophilic reaction active site originating from a crosslinker and/or a recurring unit having a crosslinkable functional group in the polymer reacts with an aromatic ring and/or hydroxyl group in the polymer under the catalysis of an acid generated upon exposure to high-energy radiation, whereby crosslinks are formed between polymer molecules. The resist composition is coated as film, exposed imagewise and developed with an alkaline developer to form a resist pattern.

The polymer used in the resist composition is defined as comprising recurring units of the general formula (1) and recurring units of at least one type selected from the general formulae (2), (3), and (4).

(1)

[structure of formula (1) showing acrylate-type monomer with Rf groups, SO₃⁻ and sulfonium cation with R², R³, R⁴]

(2)

[structure of formula (2) showing acrylate with naphthalene bearing R⁵ₐ and (OH)ᵦ]

(3)

[structure of formula (3) showing acenaphthylene-type with R⁵ₑ and (OH)ᶜ]

(4)

[structure of formula (4) showing indene-type with R⁵f and (OH)d]

Herein A is a $C_1$-$C_{10}$ divalent hydrocarbon group in which some or all hydrogen atoms may be replaced by fluorine or in which one or more methylene moiety may be replaced by oxygen. Rf is each independently hydrogen, fluorine, trifluoromethyl, or pentafluoroethyl, with the proviso that not all Rf's are hydrogen. B is a single bond or a $C_1$-$C_{10}$ alkylene group which may be separated by ethereal oxygen. $R^1$ is hydrogen, fluorine, methyl or trifluoromethyl. $R^2$, $R^3$, and $R^4$ are each independently a substituted or unsubstituted, straight or branched $C_1$-$C_{10}$ alkyl, alkenyl or oxoalkyl group, or a substituted or unsubstituted $C_6$-$C_{18}$ aryl, aralkyl or aryloxoalkyl group, or any two or more of $R^2$, $R^3$, and $R^4$, taken together, may be a divalent organic group to form a ring with the sulfur atom. $R^5$ is each independently a $C_1$-$C_6$ alkyl group. The subscript "a" is an integer of 0 to 4, b is an integer of 1 to 5, c and d each are an integer of 1 to 4, e is an integer of 0 to (4-c), f is an integer of 0 to (4-d), p is independently 0 or 1, and t is an integer of 0 to 2.

In the polymer, the recurring units of formula (1) account for 0.5 to 10 mol % and the sum of recurring units of formulae (2), (3), and (4) accounts for 50 to 99.5 mol %, based on the entire recurring units of the polymer.

The unit of formula (1) is such that upon exposure to high-energy radiation, a sulfonium cation is decomposed to generate a sulfonic acid group bound to the polymer. Since the unit has at least one fluorine atom, trifluoromethyl or pentafluoroethyl group attached to the carbon atom to which the sulfur atom of sulfonic acid is attached, the acid generated by the unit upon exposure to high-energy radiation exhibits a high acidity. "A" serving as a linker is a $C_1$-$C_{10}$ divalent hydrocarbon group, typically straight, branched or cyclic alkylene, which may be substituted with fluorine or oxygen. Preferred examples of the linker "A" are shown by the following structural formulae corresponding to formula (1) with the sulfonium cation excluded.

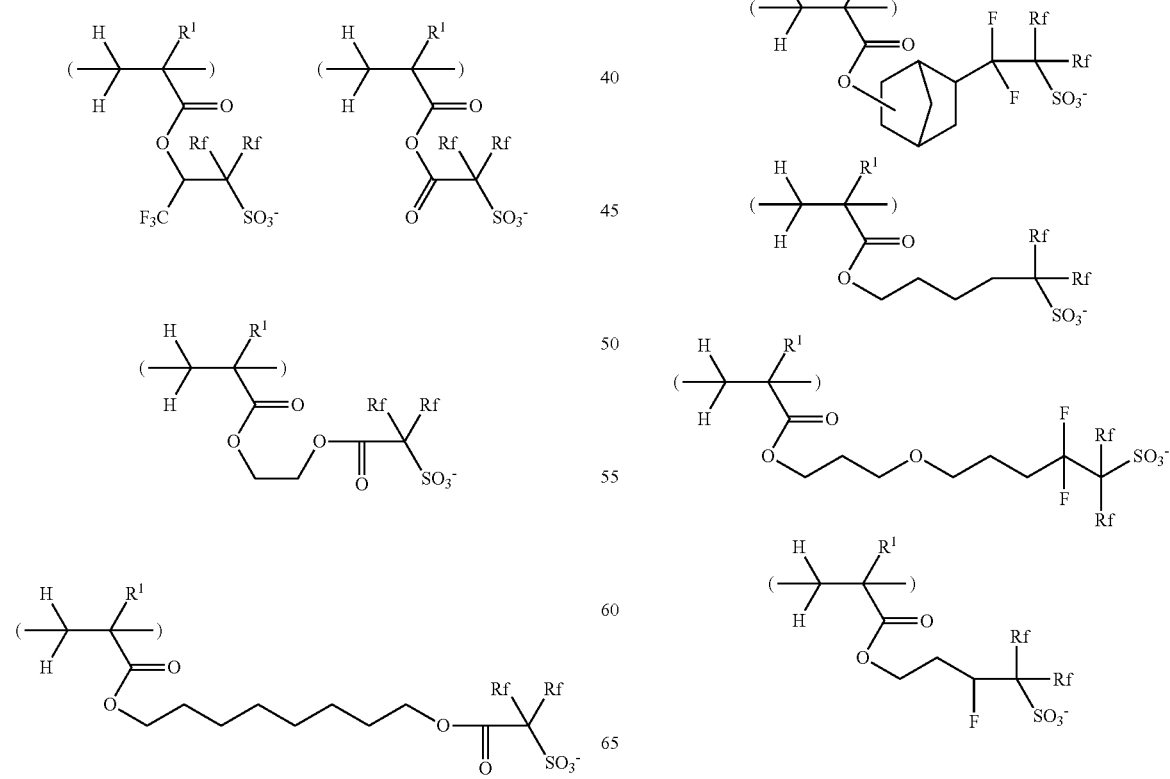

Herein Rf is as defined above.

A choice of the linker "A" may be made from other suitable groups with reference to Patent Documents 8, 9 and 10.

In formula (1), $R^2$, $R^3$, and $R^4$ are each independently an optionally substituted, straight or branched $C_1$-$C_{10}$ alkyl, alkenyl or oxoalkyl group, or an optionally substituted $C_6$-$C_{18}$ aryl, aralkyl or aryloxoalkyl group. Alternatively, any two or more of $R^2$, $R^3$, and $R^4$, taken together, may be a divalent organic group to form a ring with the sulfur atom in the formula.

Preferred examples of $R^2$, $R^3$, and $R^4$ are illustrated below. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, and thienyl; 4-hydroxyphenyl, alkoxyphenyl groups such as 4-methoxyphenyl, 3-methoxyphenyl, 2-methoxyphenyl, 4-ethoxyphenyl, 4-p-tert-butoxyphenyl, and 3-tert-butoxyphenyl; alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, 1-phenylethyl, and 2-phenylethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Where at least two of $R^2$, $R^3$, and $R^4$, taken together, form a ring with the sulfur atom, cyclic structures of the following formulae are exemplary.

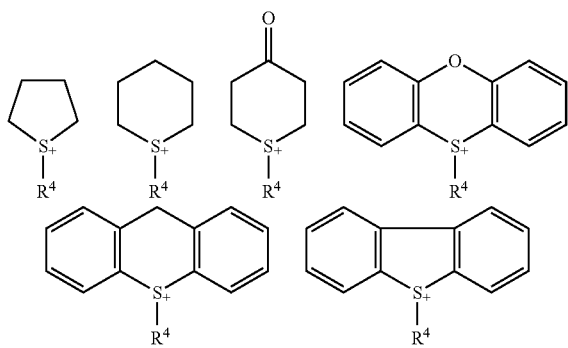

Herein $R^4$ is as defined above.

Illustrative examples of the sulfonium cation include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium. Preferred cations are triphenylsulfonium, 4-tert-butylphenyldiphenylsulfonium, 4-tert-butoxyphenyldiphenylsulfonium, tris(4-tert-butylphenyl)sulfonium, tris(4-tert-butoxyphenyl)sulfonium, and dimethylphenylsulfonium.

Of the recurring units of formula (1), units of the following formula (1a) are preferred because a higher resolution is expectable.

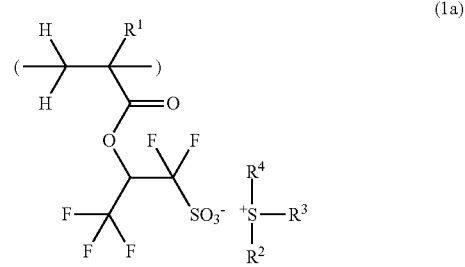

Herein $R^1$ to $R^4$ are as defined above.

Illustrative examples of the recurring units of formula (1) are given below.

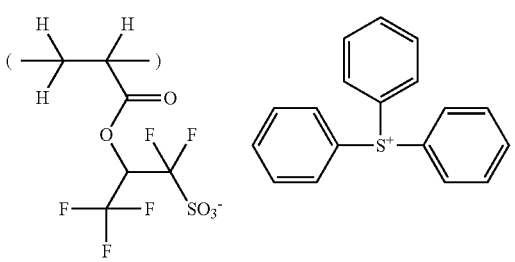

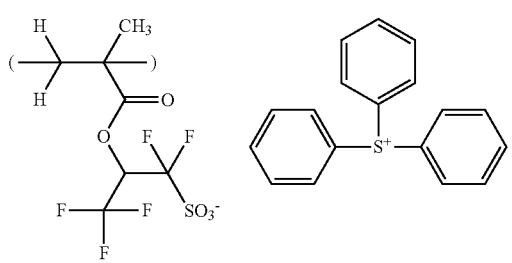

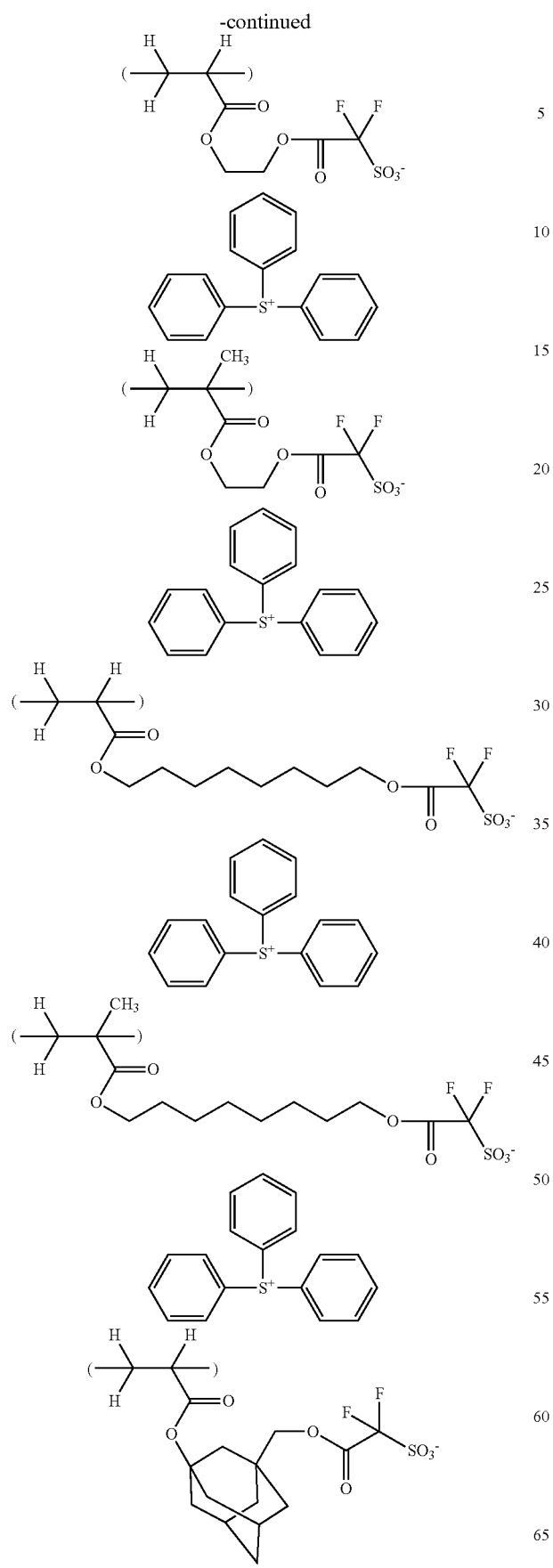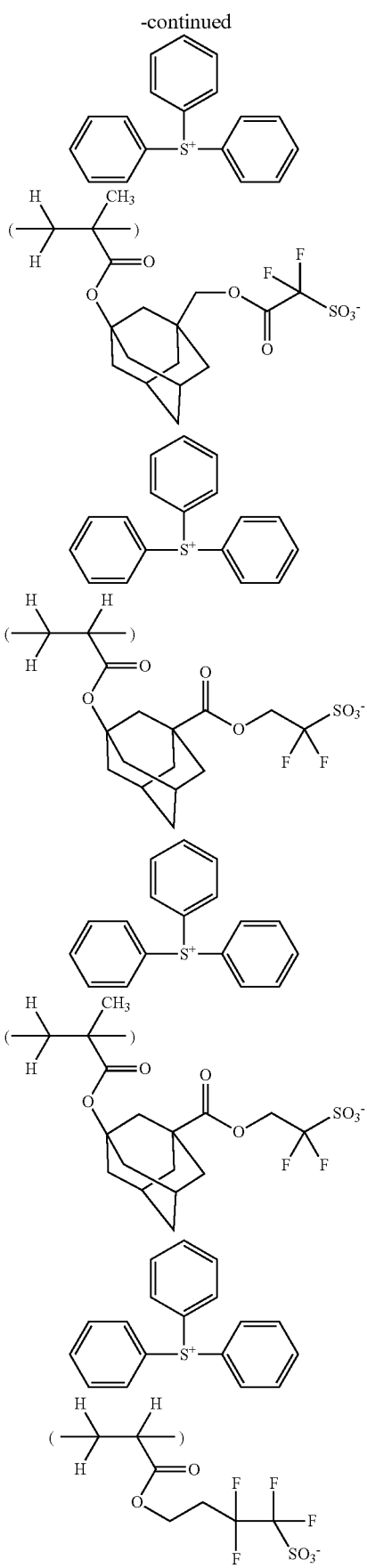

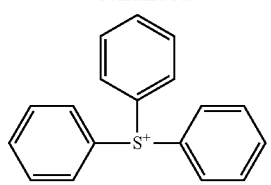
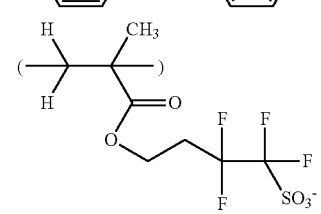
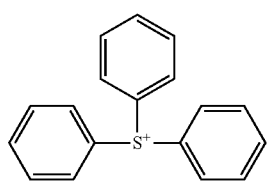
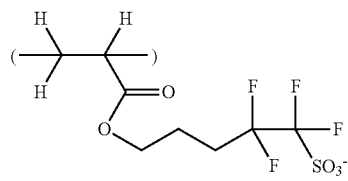
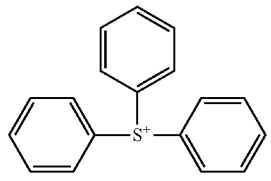
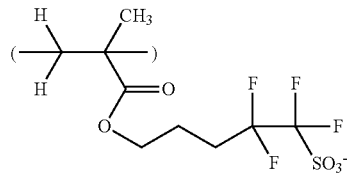
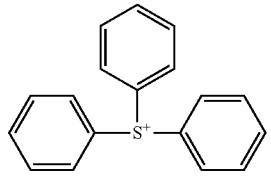
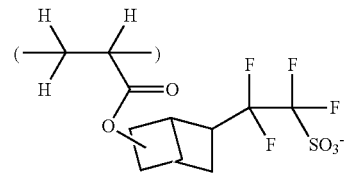
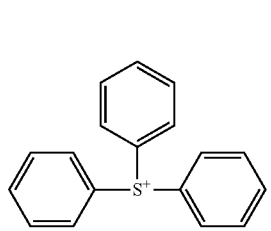
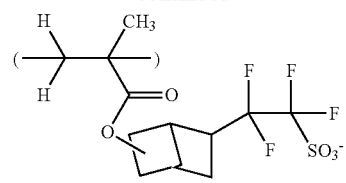
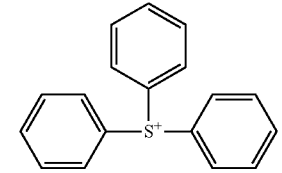
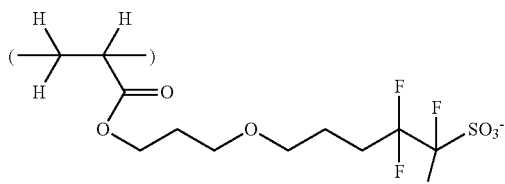
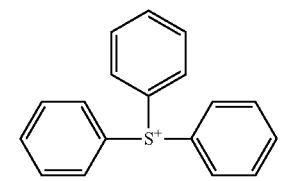
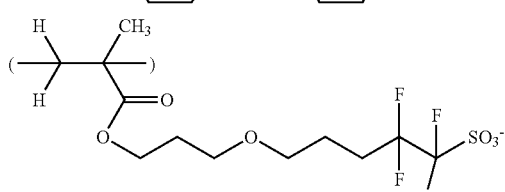
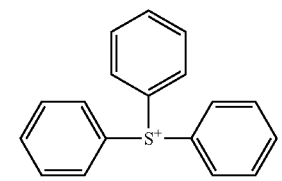
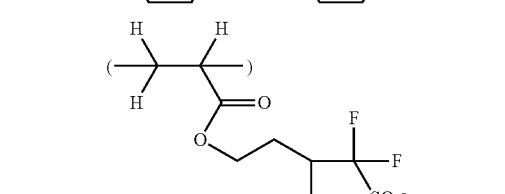
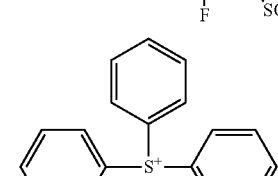
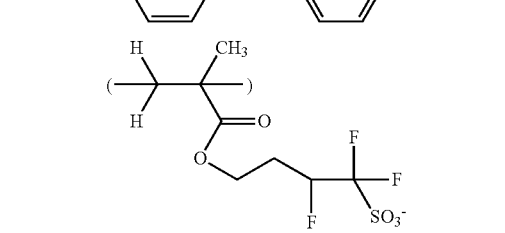

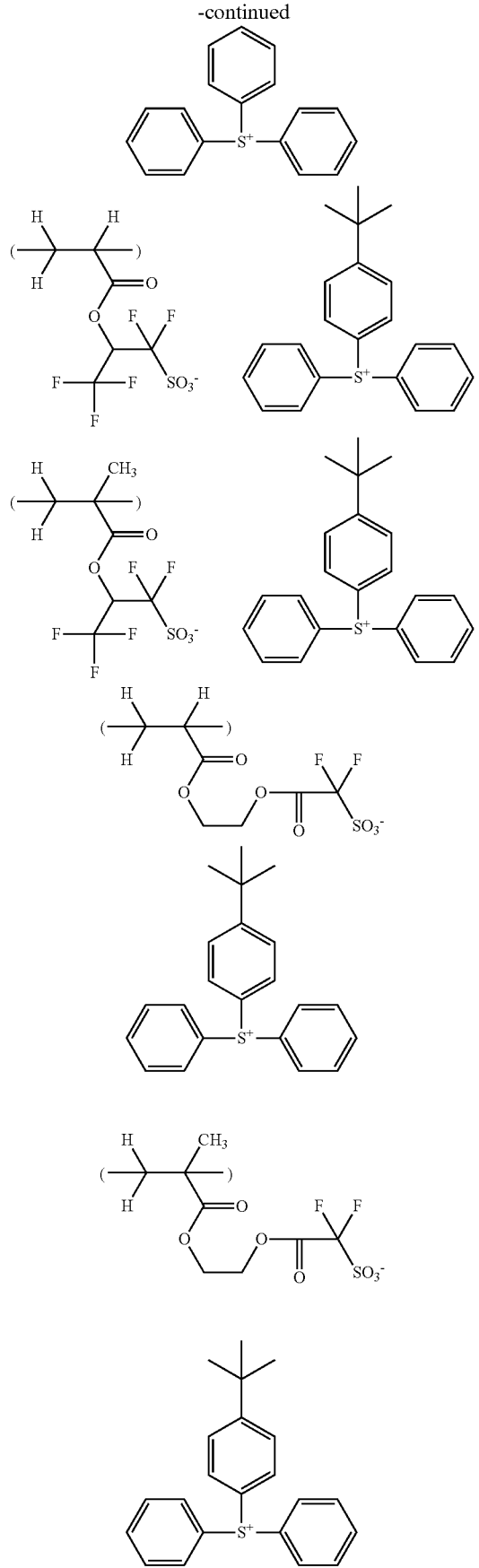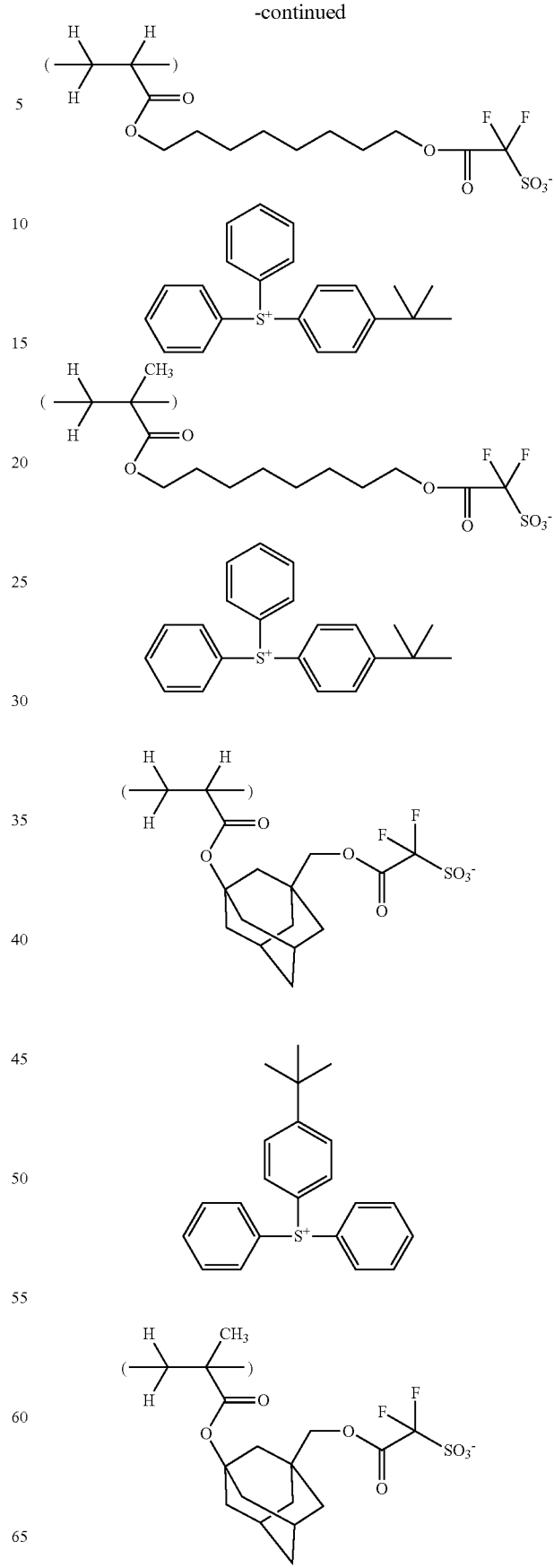

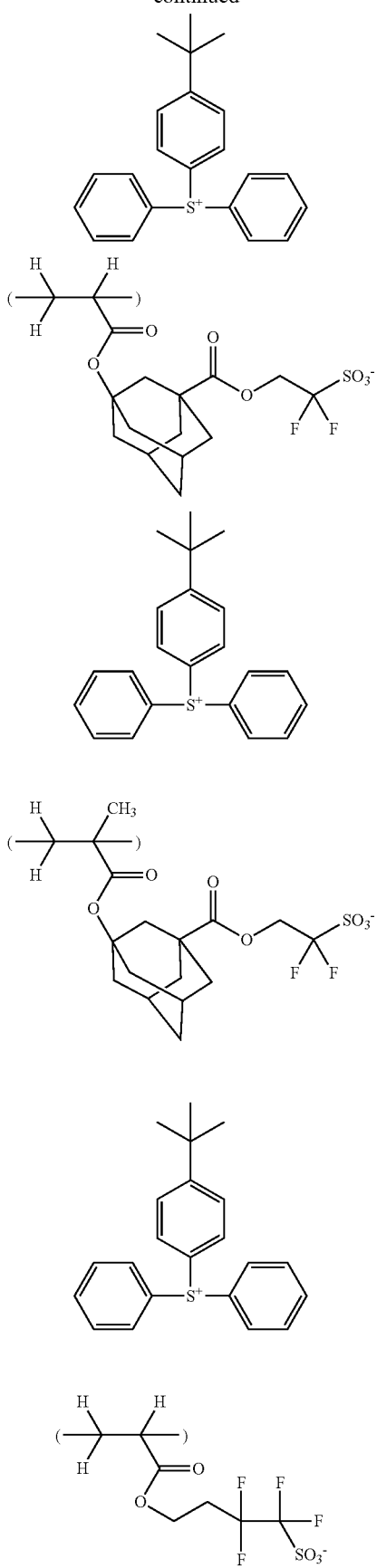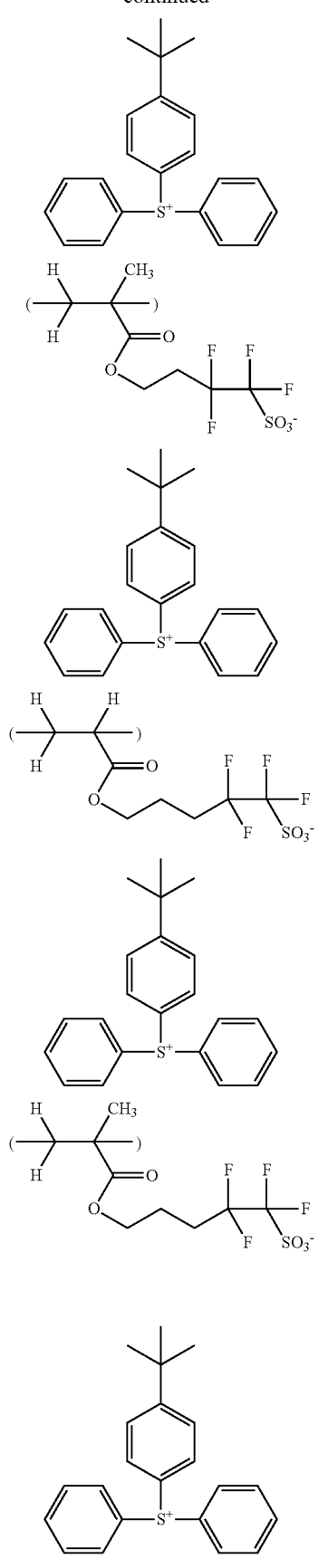

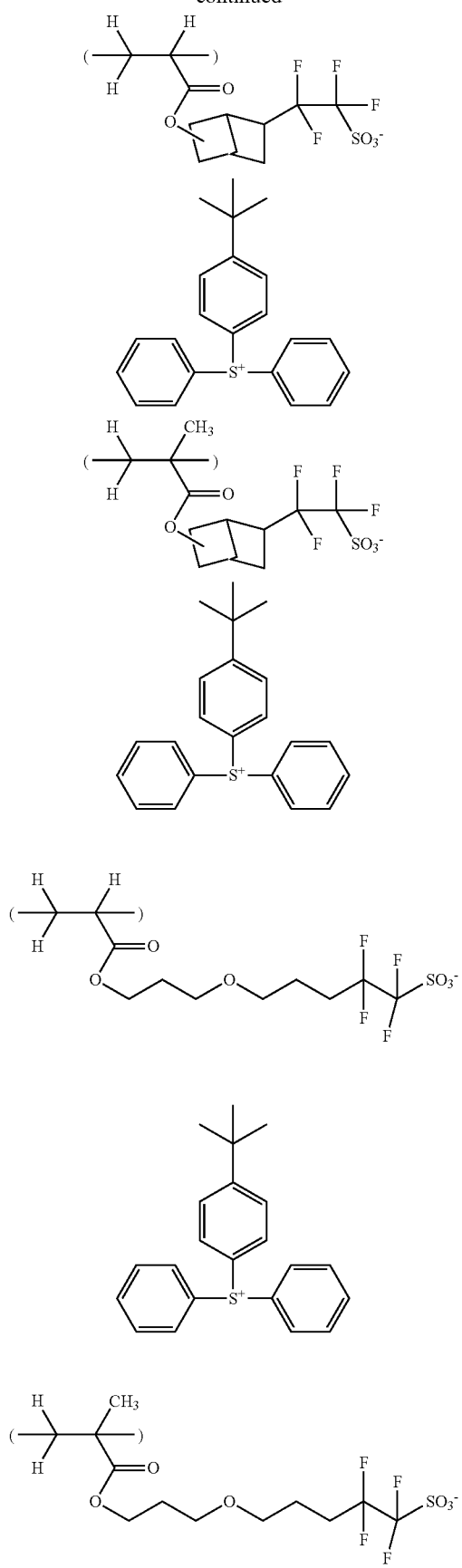
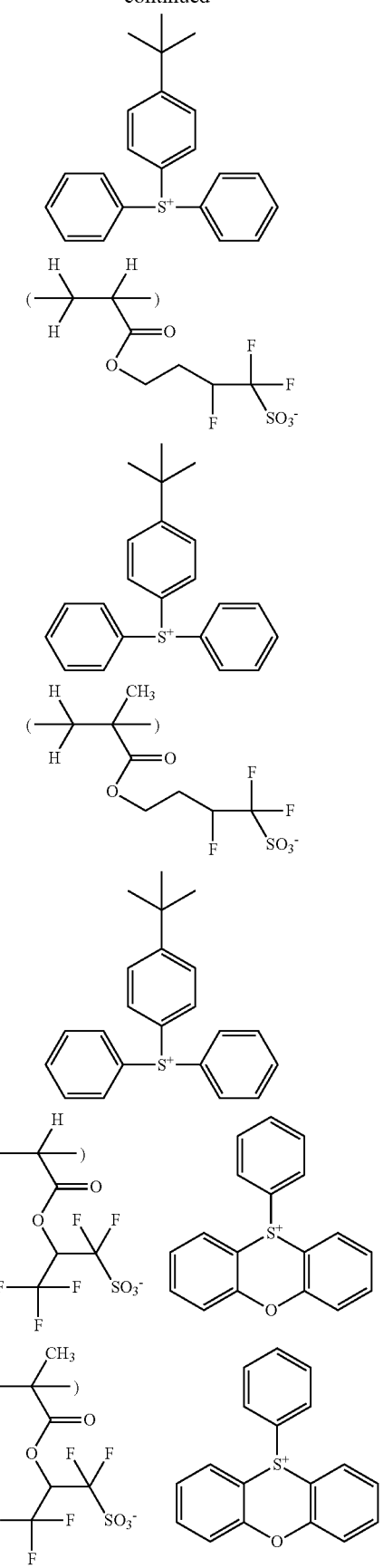

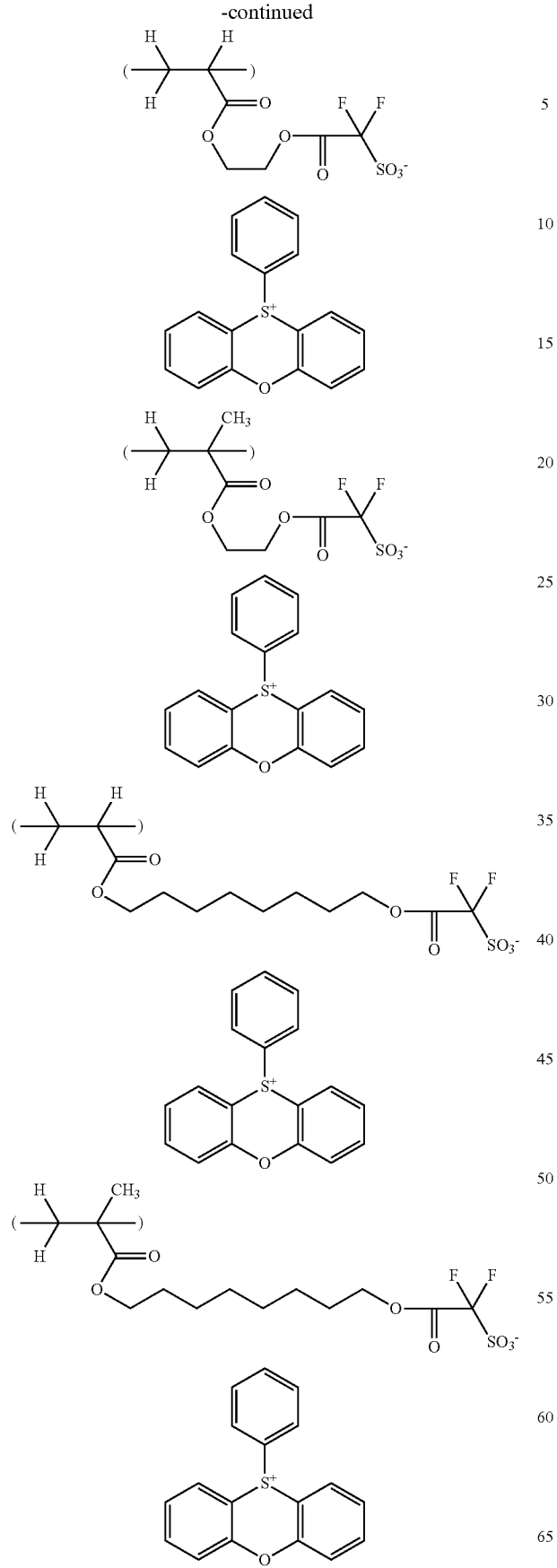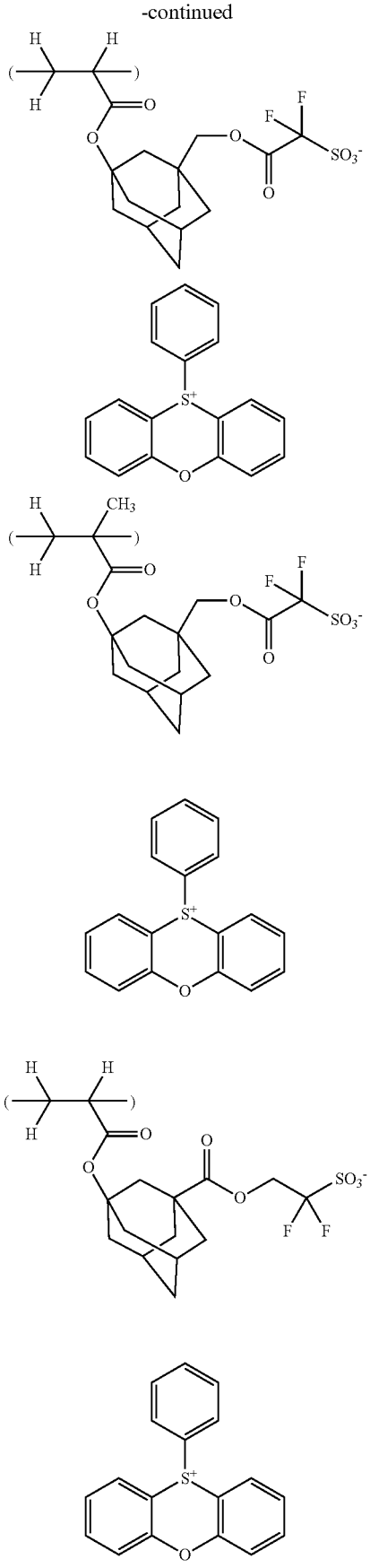

23
-continued
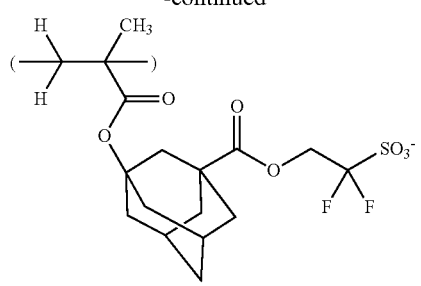
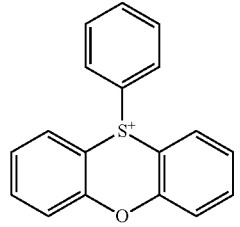
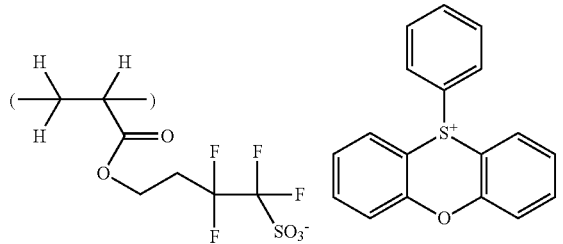
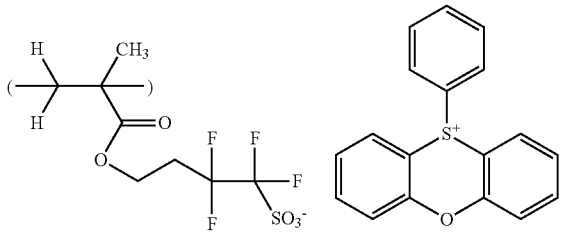
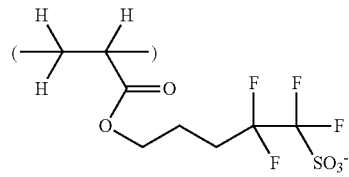
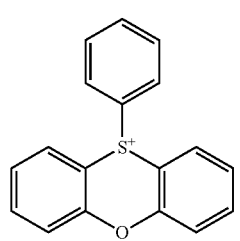
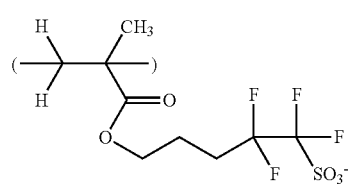
24
-continued
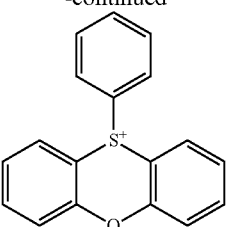
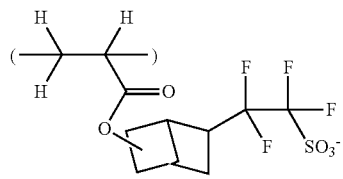
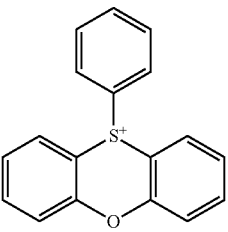
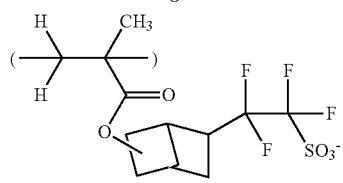
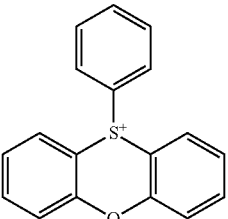
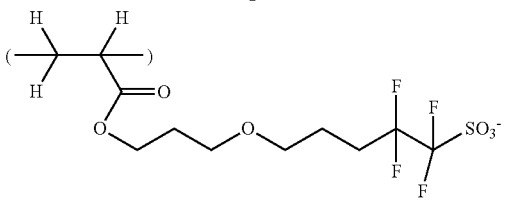
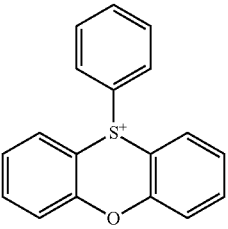
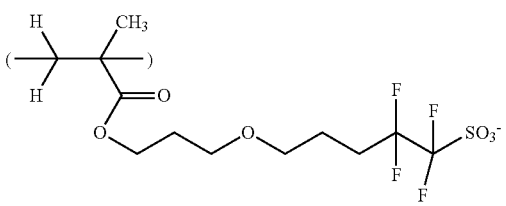

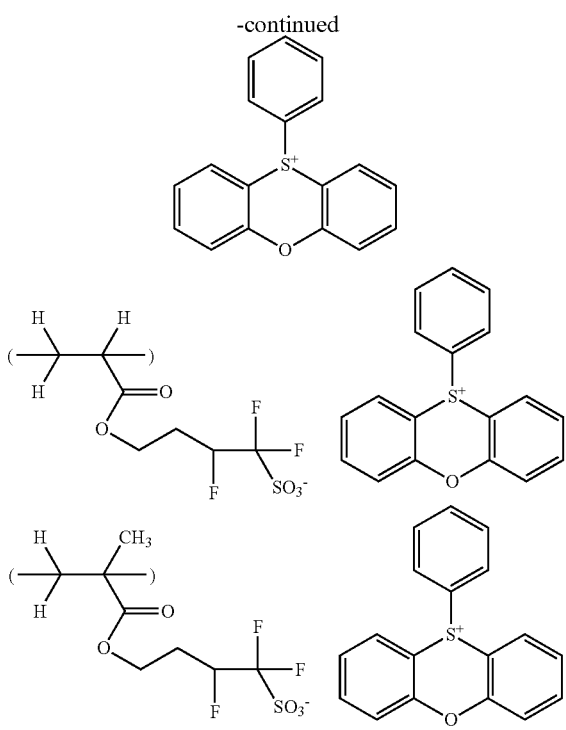

In the polymer used herein, recurring units of at least one type selected from the general formulae (2), (3), and (4) are also included as the unit which provides for solubility in alkaline developer and imparts a polarity to the molecule to make the polymer adhesive.

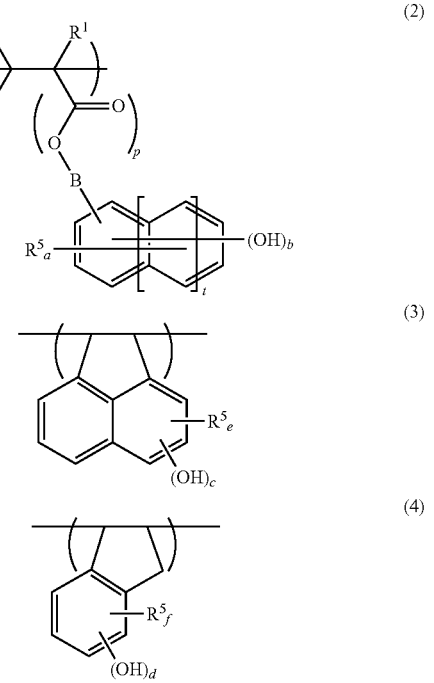

Herein, B is a single bond or a $C_1$-$C_{10}$ alkylene group which may be separated by ethereal oxygen. $R^1$ is hydrogen, fluorine, methyl, or trifluoromethyl. $R^5$ is each independently a $C_1$-$C_6$ alkyl group. The subscript "a" is an integer of 0 to 4, b is an integer of 1 to 5, c and d each are an integer of 1 to 4, e is an integer of 0 to (4-c), f is an integer of 0 to (4-d), p is independently 0 or 1, and t is an integer of 0 to 2.

In formulae (2), (3) and (4), B is a single bond or a $C_1$-$C_{10}$ alkylene group which may contain an ethereal oxygen atom (or ether bond) at an intermediate of its chain. Suitable alkylene groups include methylene, ethylene, propylene, butylene, pentylene, and hexylene, as well as structural isomers of a carbon skeleton having branched or cyclic structure. For the alkylene group containing ethereal oxygen, where p in formula (2) is 1, the ethereal oxygen atom may be incorporated at any position excluding the position between the α- and β-carbons relative to the ester oxygen. Where p is 0, the atom in B that bonds with the main chain becomes an ethereal oxygen atom, and a second ethereal oxygen atom may be incorporated at any position excluding the position between the α- and β-carbons relative to that ethereal oxygen atom. Alkylene groups having more than 10 carbon atoms are undesirable because of a low solubility in alkaline developer.

$R^5$ is each independently a $C_1$-$C_6$ alkyl group. Preferred examples of the alkyl group include methyl, ethyl, propyl, isopropyl, butyl, pentyl, hexyl, and structural isomers of a carbon skeleton having branched or cyclic structure. Alkyl groups having more than 6 carbon atoms are undesirable because of a low solubility in alkaline developer.

The subscript "a" is an integer of 0 to 4, and b is an integer of 1 to 5. Preferably, a is an integer of 0 to 3, and b is an integer of 1 to 3 when t is 0. Also preferably, a is an integer of 0 to 4, and b is an integer of 1 to 5 when t is 1 or 2.

The subscript t is an integer of 0 to 2. The structure represents a benzene skeleton when t=0, a naphthalene skeleton when t=1, and an anthracene skeleton when t=2. In these cases, linker B may be attached to the naphthalene or anthracene ring at any desired position.

Also c is an integer of 1 to 4, d is an integer of 1 to 4, e is an integer of 0 to (4-c), and f is an integer of 0 to (4-d).

Of the recurring units of formula (2), those recurring units wherein p is 0 and B is a single bond (meaning that the aromatic ring is directly bonded to the main chain of the polymer), that is, linker-free recurring units are units derived from monomers in which a 1-substituted or unsubstituted vinyl group is attached to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units wherein p is 1, that is, recurring units having an ester structure as the linker are units of carbonyloxy-substituted vinyl monomers as typified by (meth)acrylates.

Preferred examples of the units of formula (2) having a linker (—CO—O—B—) derived from (meth)acrylates are shown below.

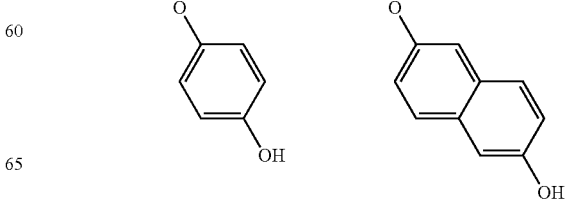

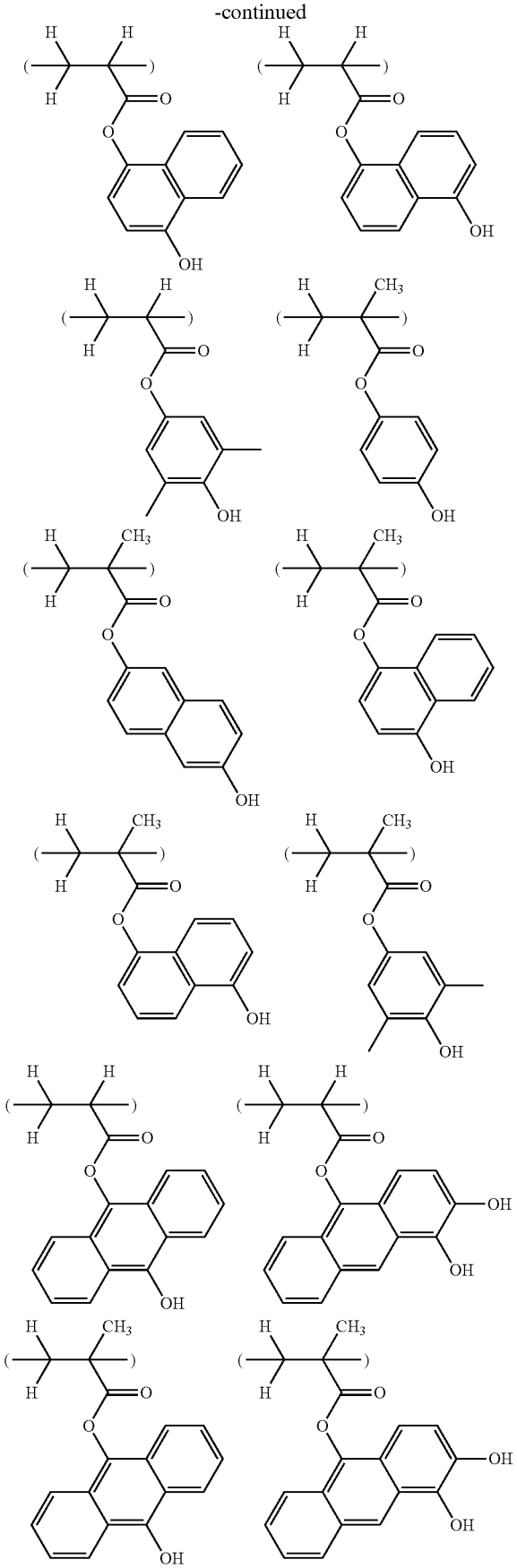
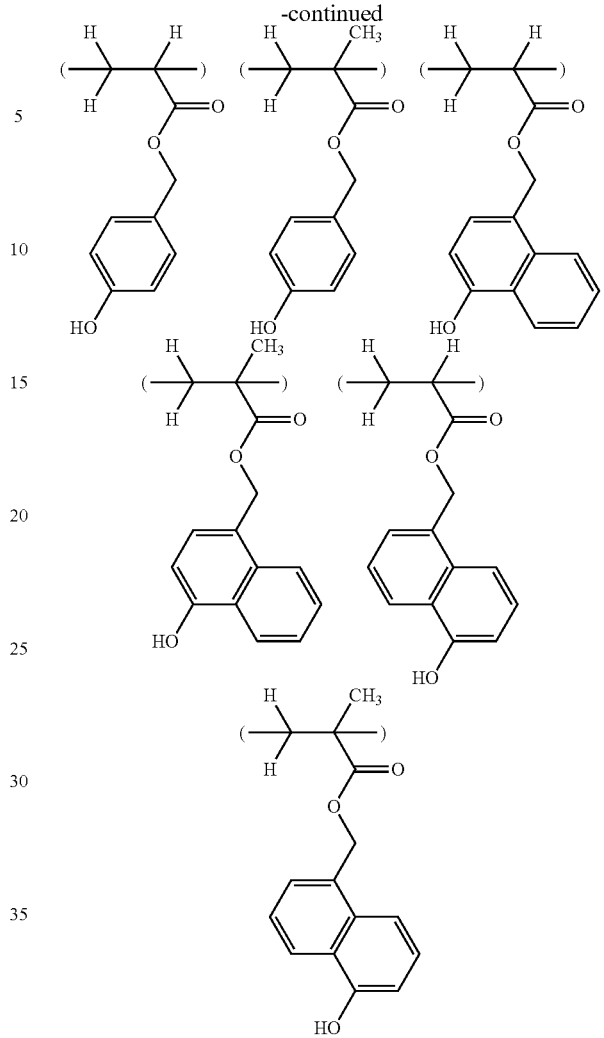

It is well known that a polymer having high etch resistance is obtained using an acenaphthylene compound (from which units of formula (3) are derived) or indene compound (from which units of formula (4) are derived) as a monomer for polymerization. The recurring units shown below are preferred in that corresponding monomers are readily available and the desired effects are achievable.

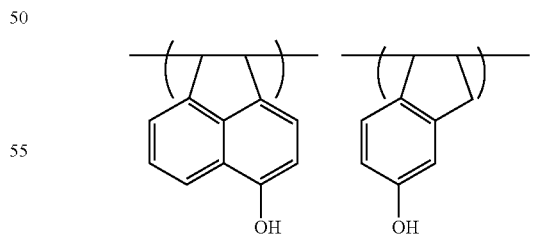

The polymer used in the resist composition preferably contains at least 5 mol % of recurring units free of an acidic functional group such as phenolic hydroxyl group, based on the entire recurring units, in order to achieve high resolution. Preferred examples of the recurring units free of an acidic functional group include those of the general formulae (5), (6), and (7).

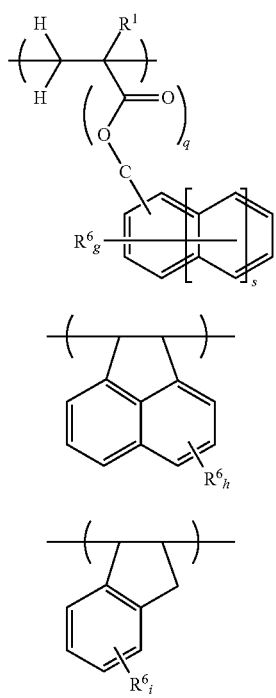

(5)

(6)

(7)

Herein C is a single bond or a $C_1$-$C_{10}$ alkylene group which may be separated by ethereal oxygen, $R^1$ is as defined above, $R^6$ is each independently halogen, an optionally halo-substituted $C_1$-$C_8$ alkyl or alkoxy group, a $C_6$-$C_{20}$ aromatic ring-containing hydrocarbon group, or an optionally halo-substituted $C_1$-$C_{12}$ acyloxy group, g is an integer of 0 to 5, h and i each are an integer of 0 to 4, q is 0 or 1, and s is an integer of 0 to 2.

For group $R^6$, exemplary halogen atoms include fluorine, chlorine and bromine. When $R^6$ is an alkyl or alkoxy group, the alkyl moiety is of 1 to 10 carbon atoms, preferably 1 to 8 carbon atoms, and preferred alkyl moieties include methyl, ethyl, propyl, isopropyl, butyl, pentyl, hexyl, heptyl, octyl, and structural isomers thereof, as well as cyclopentyl, cyclohexyl, and cyclooctyl. When $R^6$ is a hydrocarbon group or hydrocarbonoxy group in which the hydrocarbon moiety is an aromatic ring-containing moiety, optionally substituted aromatic ring-containing groups of 6 to 20 carbon atoms are preferred. Suitable aromatic ring-containing groups include optionally alkyl-substituted phenyl, naphthyl, benzyloxy, naphthyloxy, and phenethyl groups. When $R^6$ is an optionally halo-substituted $C_1$-$C_{12}$ acyloxy group, preferred groups include methylcarbonyloxy, ethylcarbonyloxy, propylcarbonyloxy, isopropylcarbonyloxy, cyclopentylcarbonyloxy, cyclohexylcarbonyloxy, cyclooctylcarbonyloxy, phenylcarbonyloxy, and naphthylcarbonyloxy.

As the recurring unit free of an acidic functional group, in another embodiment, the polymer may comprise a recurring unit having a function of forming crosslinks in the presence of an acid catalyst. The recurring unit having a function of forming crosslinks in the presence of an acid catalyst has an active structure of the reaction mechanism that undergoes dealcoholization, dehydration or ring-opening reaction in the presence of an acid catalyst to form a cation center and to form a bond to aromatic ring or hydroxyl group through electrophilic substitution reaction. The recurring unit having a function of forming crosslinks in the presence of an acid catalyst may be selected from well-known active structures as described in Patent Document 11, for example, recurring units having an oxirane structure, typically epoxy group. Besides, recurring units having a urea structure as shown below may be used as the above units and are preferred from the standpoint of shelf stability. Preferred examples of the recurring unit having such a function include those of the formulae (M-1) and (M-2):

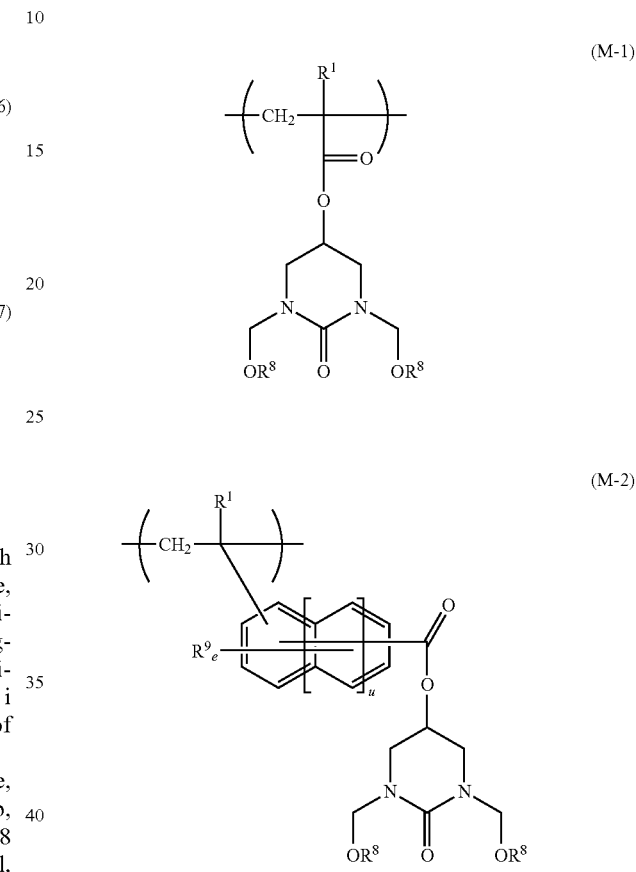

wherein $R^1$ is hydrogen, fluorine, methyl, or trifluoromethyl, $R^8$ is hydrogen or a straight, branched or cyclic $C_1$-$C_6$ monovalent hydrocarbon group, $R^9$ is each independently a straight, branched or cyclic $C_1$-$C_6$ monovalent hydrocarbon group which may contain oxygen, or halogen, e is an integer of 0 to 4, and u is an integer of 0 to 2.

Useful recurring units not exhibiting acidity which may be incorporated in the polymer are units of formula (M-1) or (M-2). The recurring unit of formula (M-1) or (M-2) functions such that alcohol or water is eliminated under the catalysis of the acid generated upon exposure to high-energy radiation, and the resulting moiety reacts with an aromatic ring or hydroxyl group to form crosslinks between polymer molecules. When a crosslinker which is not a polymer to be added to the resist composition is, in part or in entirety, replaced by this recurring unit, the sensitivity of a resist film can be improved without sacrificing shelf stability.

For the purpose of incorporating the crosslinking unit described above, for example, a polymerizable monomer (Y-1) may be obtained through reactions according to the following scheme using 1,3-diamino-2-propanol (8) as the starting reactant. Herein, Me stands for methyl, and Et for ethyl.

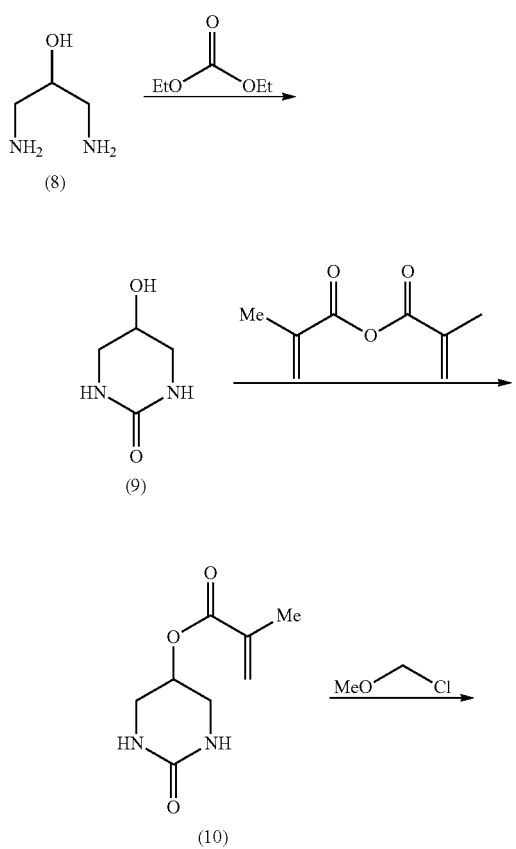

(8)

(9)

(10)

(Y-1)

Other useful examples of the recurring unit not exhibiting acidity which may be incorporated in the polymer include units of the following formula (11), (12) or (13):

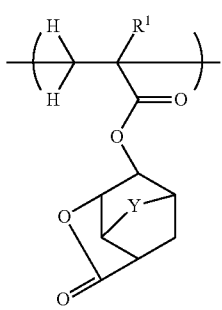

(11)

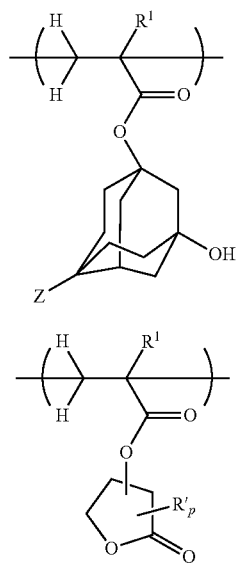

(12)

(13)

wherein $R^1$ is hydrogen, methyl or trifluoromethyl, Y is oxygen or methylene, Z is hydrogen or hydroxyl, R' is $C_1$-$C_4$ alkyl, and p is an integer of 0 to 3. These units may be used as auxiliary units which exhibit no acidity and impart adhesion-to-substrate.

A resist composition comprising a polymer as defined above can prevent localization of the acid generating component during formation of a resist film, which is effective for the purpose of minimizing LER as is well known in the art. However, the dissolution behavior of the polymer before and after exposure is disadvantageous for the negative tone as mentioned above. Unexpectedly, it has been found that both LER and high resolution can be met by designing the polymer as follows.

Specifically, the recurring units having a fluorinated sulfonic acid salt side chain as represented by formula (1) account for 0.5 to 10 mol %, based on the entire recurring units of the polymer. In the resist composition, an acid generator which is not bound to a polymer or a polymer comprising a sulfonic acid salt unit having a relatively low acidity, other than the fluorinated sulfonic acid as represented by formula (1) may be used as an auxiliary component. If a proportion of the recurring units represented by formula (1) is less than 0.5 mol %, the auxiliary acid generator component must be used in a larger amount to acquire an effective sensitivity. When the amount of the non-polymer-bound acid generator is increased, LER is exacerbated. When the amount of weak sulfonic acid salt unit is increased, high resolution is difficultly available.

On the other hand, the recurring units containing a phenolic hydroxyl group as represented by formulae (2), (3) and (4) account for 50 to 99.5 mol %, preferably 60 to 99.5 mol %, based on the entire recurring units of the polymer. The lower limit is preferably at least 65 mol % when at least half of the recurring units belonging to this class are not units of formula (2) wherein p is 1. The upper limit is preferably up to 85 mol % when at least half of the recurring units belonging to this class are units of formula (2).

If a proportion of the recurring units containing a phenolic hydroxyl group is less than 50 mol %, there is a likelihood of scum formation and bridge formation between resist pattern features during development.

Where recurring units of formula (5), (6) or (7) are further incorporated, they preferably account for up to 40 mol %, more preferably up to 30 mol %, based on the entire recurring units of the polymer (=100 mol %). If a proportion of these recurring units is too high, the polymer may have so low a solubility in alkaline developer as to cause scum.

Where crosslinkable recurring units represented by formula (M-1) or (M-2) are incorporated, they typically account for at least 5 mol %, based on the entire recurring units of the polymer to ensure the solubility changing capability. As long as a proportion of the crosslinkable unit is up to about 20 mol % as the upper limit, the above-mentioned polymer design is applicable without substantial changes. The proportion of the crosslinkable unit may be reduced below 5 mol % when another crosslinker is used together.

Where recurring units represented by formula (11), (12) or (13) are incorporated, they preferably account for up to 30 mol %, more preferably up to 20 mol %, based on the entire recurring units of the polymer. If a proportion of these recurring units is too high, etch resistance may be exacerbated.

The polymer comprising the recurring units defined above for use in the resist composition may be prepared in any well-known ways by selecting suitable monomers, and carrying out copolymerization, optionally with protection and deprotection reactions combined. The copolymerization reaction is preferably radical polymerization, but not limited thereto. With respect to the polymerization method, reference may be made to Patent Documents 6 to 10.

The polymer generally has a weight average molecular weight (Mw) of 1,000 to 50,000, and preferably 1,000 to 20,000, as measured by gel permeation chromatography (GPC) using polystyrene standards. A polymer with a Mw of less than 1,000 may lead to a pattern having a rounded top, reduced resolution, and degraded LER as is well known in the art. If Mw is higher than the necessity, the pattern tends to have increased LER, depending on the pattern size to be resolved. The Mw is preferably controlled to 20,000 or less particularly when a pattern having a line width of up to 100 nm is formed. It is noted that the GPC measurement generally uses tetrahydrofuran (THF) solvent. Some polymers within the scope of the invention are not dissolvable in THF, and in this event, GPC measurement is made in dimethylformamide (DMF) solvent having up to 100 mM of lithium bromide added thereto.

The polymer preferably has a narrow dispersity as demonstrated by a molecular weight distribution Mw/Mn in the range of 1.0 to 3.0, more preferably 1.0 to 2.5. If the dispersity is broader, the pattern after development may have foreign particles deposited thereon, or the pattern profile may be degraded.

Although monomers including the abovementioned other recurring units may be incorporated as the additional recurring units, they should preferably exhibit an acidity which is equal to or less than the acidity of the recurring unit having a phenolic hydroxyl group.

In addition to the polymer comprising recurring units having formula (1), the resist composition may further comprise another polymer free of recurring units having formula (1). For the sake of convenience, the polymer comprising recurring units having formula (1) and the other polymer free of recurring units having formula (1) are referred to as first and second polymers, respectively. The second polymer has such a function that it reacts with a crosslinker (to be described later) or a recurring unit having a crosslinking capability in the first polymer in the presence of an acid catalyst whereupon it becomes insoluble in developer. Many such polymers are known in the art. To avoid an increase of LER, the second polymer must be highly compatible with the first polymer. In this respect, the second polymer is preferably a polymer free of units of formula (1), but comprising other analogous units as major units, and specifically, a polymer comprising units of formulae (2) to (7), (M-1), and (M-2) as major units.

When the second polymer comprising units of formulae (2) to (7), (M-1), and (M-2) as major units, but free of units of formula (1) is used in combination with the first polymer comprising units of formula (1), the second polymer may be used as a single polymer or as a mixture of two or more second polymers. The important factors to be taken into account in the design of the second polymer are compatibility and dissolution rate.

In order to provide an optimum dissolution rate of a resist film, the second polymer should preferably comprise 50 to 95 mol %, more preferably 60 to 90 mol % of phenolic hydroxyl-containing units represented by formulae (2), (3) and (4) based on the entire recurring units. If the proportion of the phenolic hydroxyl-containing units is less than 50 mol %, there is an increased likelihood of scum formation and bridge formation between pattern features during development. If the proportion of the phenolic hydroxyl-containing units exceeds 95 mol %, the pattern is prone to be undercut and on some substrates, pattern collapse may occur. Among the remaining recurring units, recurring units of formulae (5) to (7) are effective for providing good compatibility and etching properties, and recurring units of formulae (M-1) and (M-2) are effective for increasing sensitivity. Where a mixture of two or more second polymers is used, one or more polymers may deviate from the range as long as the mixture as a whole falls within the range.

When the second polymer is used in blend with the first polymer, the first polymer is preferably present in an amount of 30 to 100% by weight of the polymer blend. Less than 30% by weight of the first polymer may fail to achieve the LER improving effect.

In the chemically amplified negative resist composition wherein the first polymer is free of the crosslinkable recurring units, a crosslinker may be separately added. Even when the first polymer comprises the crosslinkable recurring units, a crosslinker may be added as an auxiliary component. With respect to the crosslinker for chemically amplified negative resist compositions, a number of suitable crosslinkers are known in the art as illustrated in Patent Documents 1 to 3.

Examples of the crosslinker to be separately added include alkoxymethylglycolurils and alkoxymethylmelamines, such as tetramethoxymethylglycoluril, 1,3-bismethoxymethyl-4,5-bismethoxyethyleneurea, bismethoxymethylurea, hexamethoxymethylmelamine, and hexaethoxymethylmelamine.

In the negative resist composition, the crosslinker is preferably added in an amount of 2 to 40 parts, more preferably 5 to 20 parts by weight per 100 parts by weight of the overall polymers. The crosslinker may be used alone or in admixture of two or more.

The resist composition of the invention is characterized by controlled acid diffusion. That is, the recurring unit having formula (1) in the polymer is capable of generating an acid upon exposure to high-energy radiation. Since the acid thus generated is bound to the polymer, acid diffusion is controlled. In this sense, essentially another acid generator need not be added to the resist composition. However, when it is desired to increase sensitivity or to tailor the pattern profile or other properties, another acid generator may be added as an auxiliary component in a small amount. If the separate acid generator is added in excess, the effect assigned to the polymer-bound acid generator may be lost. Then the amount of the separate acid generator added should preferably be less than the molar equivalent based on the structure having formula (1) contained as recurring units in the polymer, and more preferably up to one half of the molar equivalent based on the structure having formula (1).

The acid generator which is added separate from the polymer may be selected from well-known acid generators as enumerated in Patent Documents 1 to 3, depending on desired properties to be tailored. Preferred examples of the acid generator are shown below.

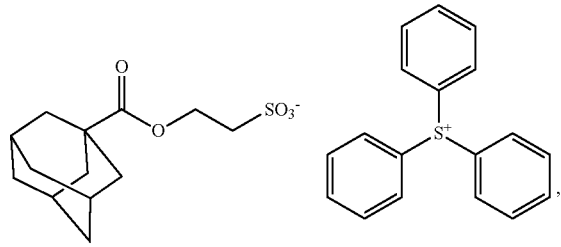

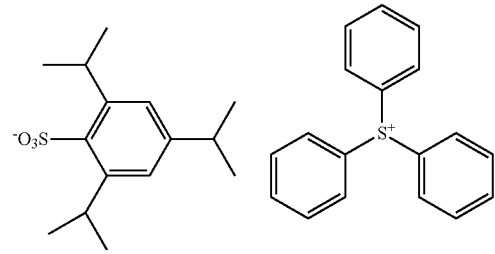

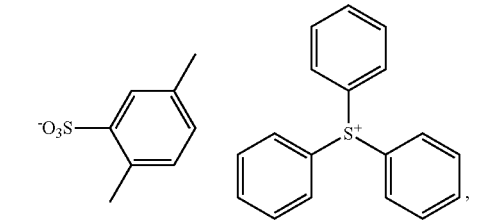

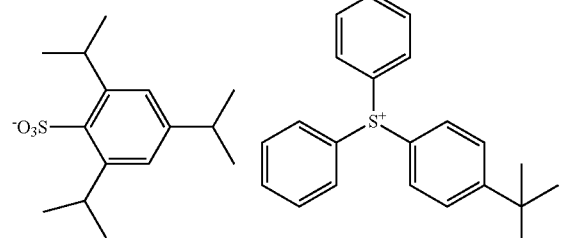

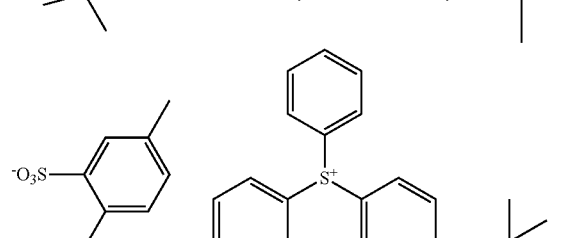

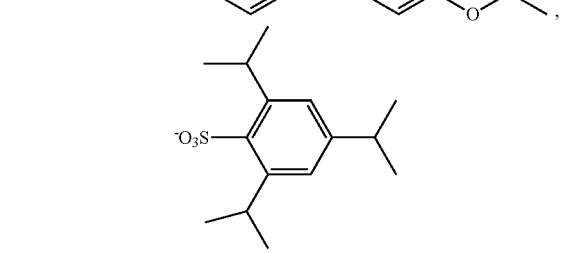

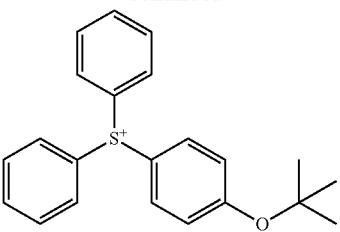

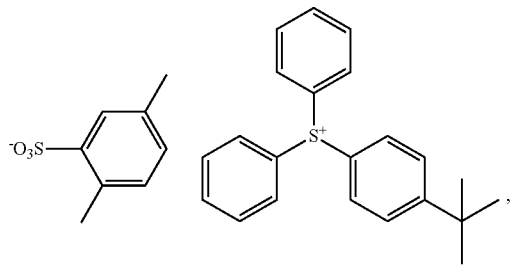

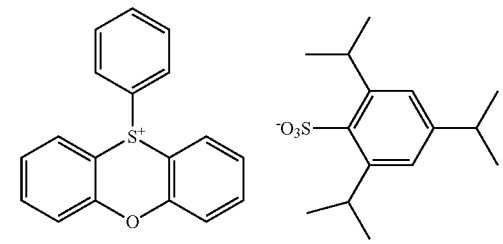

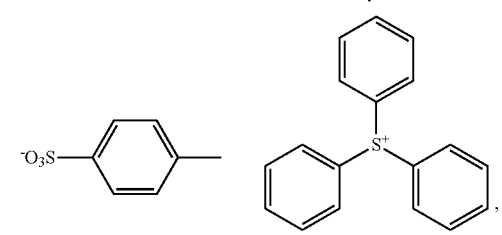

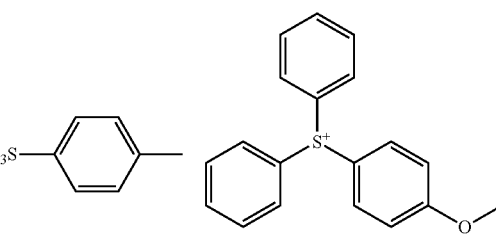

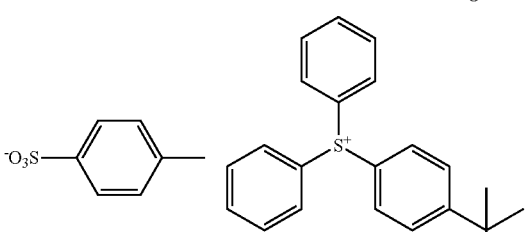

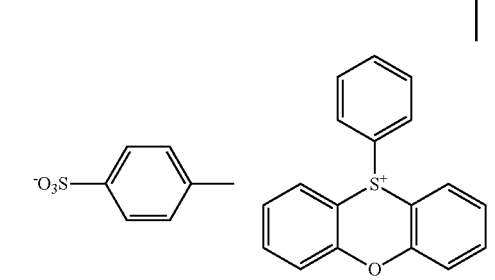

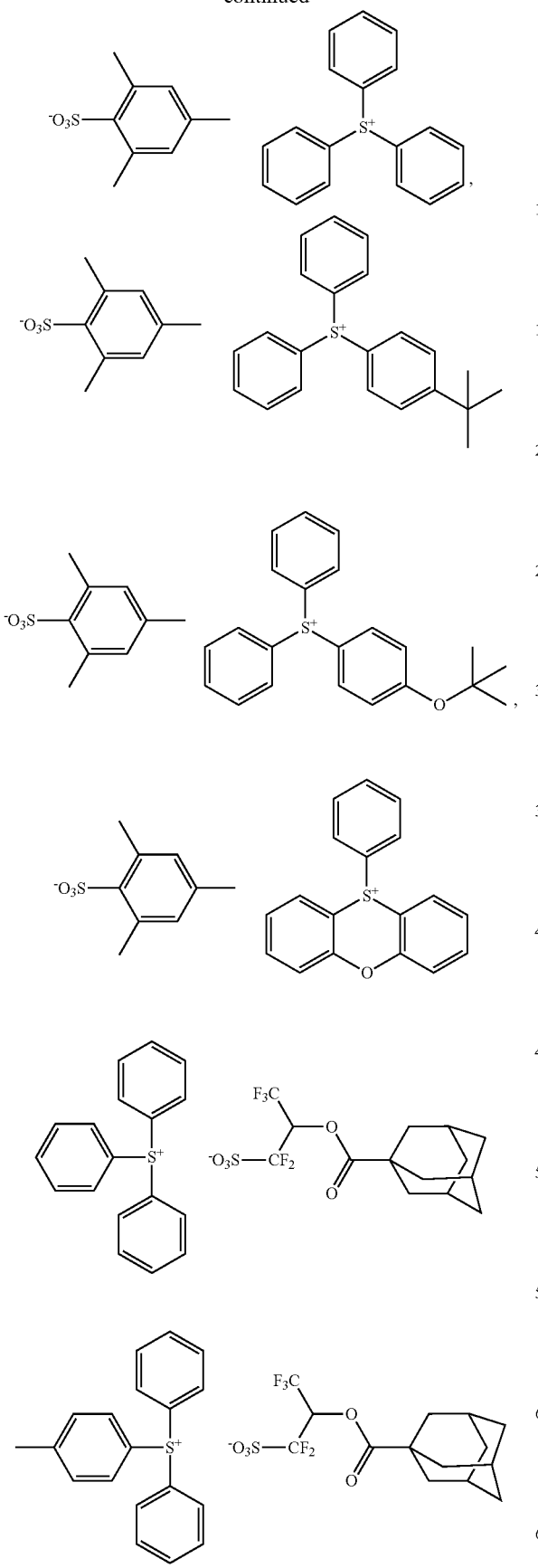
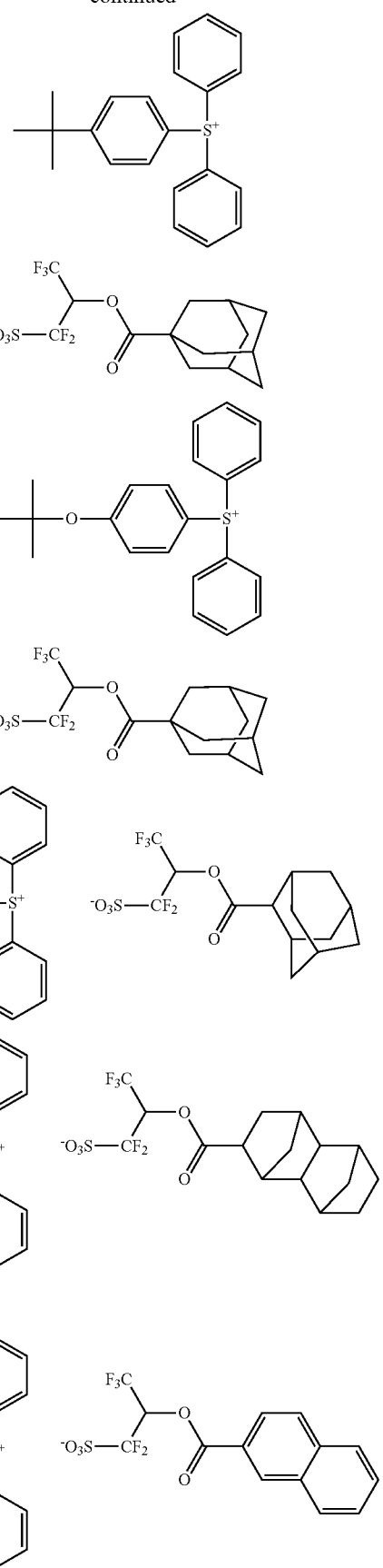

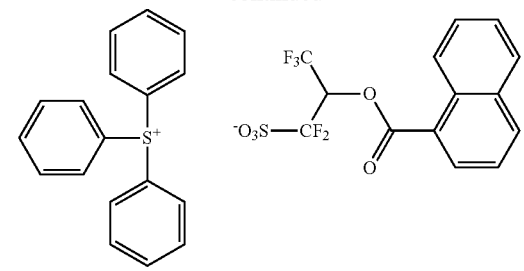
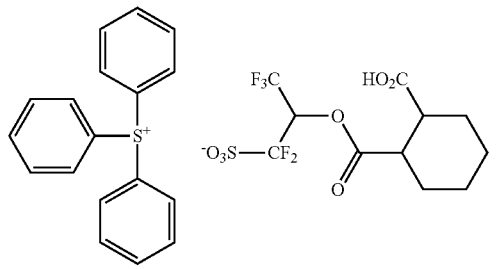
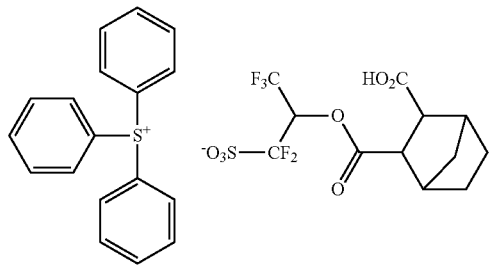
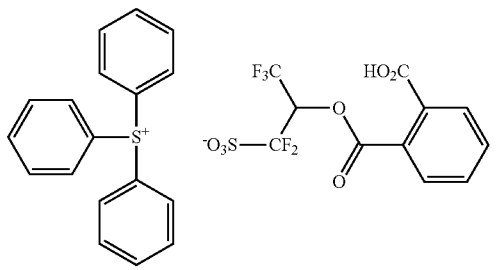
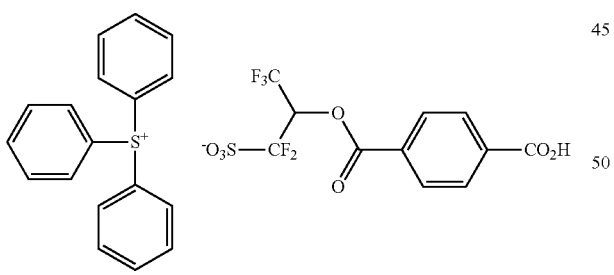
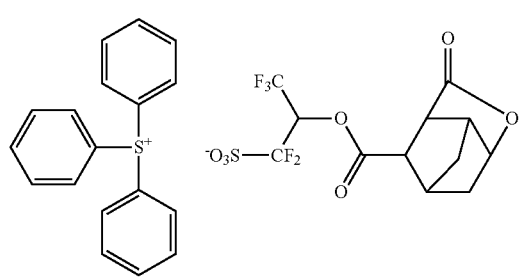
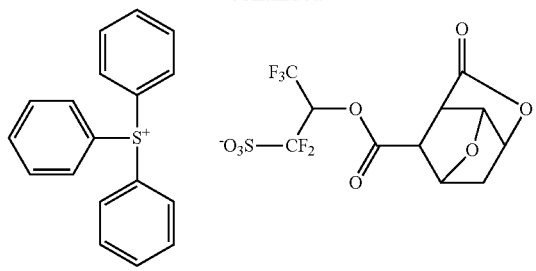
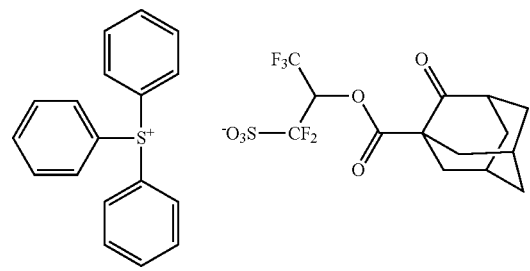
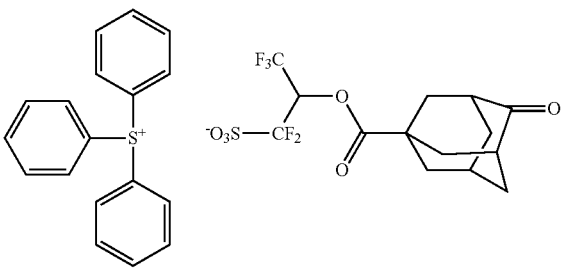
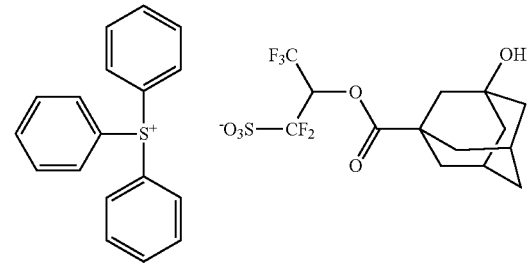
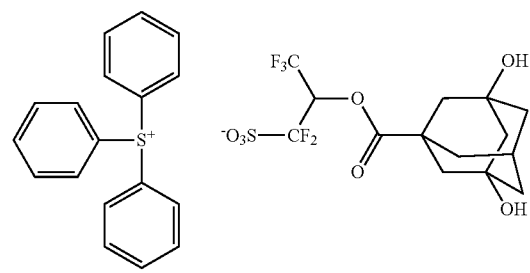
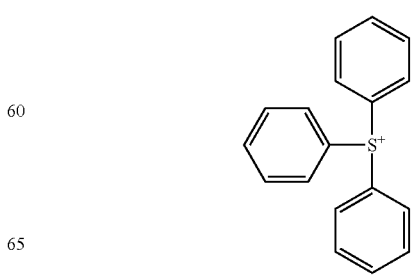

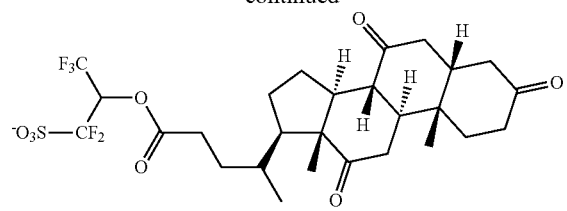

An alternative method of adding an acid generator is by adding a polymer free of units of formula (1), comprising recurring unit having a sulfonium cation which is decomposed to generate a polymer-bound sulfonic acid group upon exposure to high-energy radiation. When a recurring unit capable of generating a sulfonic acid group having a non-fluorinated side chain is incorporated into a polymer for use in negative resist compositions, the resulting polymer may sometimes fail to ensure solubility as resist material, or the unit may not be incorporated in a sufficient amount for negative tone reaction to take place. However, when a polymer comprising a recurring unit capable of generating a sulfonic acid group having a non-fluorinated side chain is added to the resist composition of the invention, partial cation exchange occurs between the sulfonic acid generated by the recurring unit capable of generating a sulfonic acid group having a fluorinated side chain and the recurring unit of sulfonium having a non-fluorinated side chain, which enables fine adjustment of acid strength while suppressing acid diffusion.

The preferred recurring unit capable of generating a sulfonic acid group having a non-fluorinated side chain has the general formula (14):

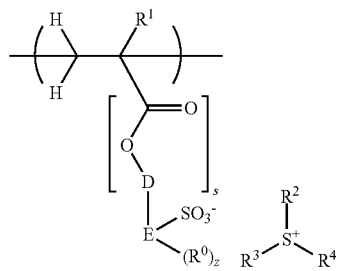

(14)

wherein $R^1$ to $R^4$ are as defined in formula (1), $R^0$ is each independently $C_1$-$C_{10}$ alkyl, D is a single bond or a $C_1$-$C_{10}$ divalent organic group which may be separated by an ether bond, E is a benzene ring or a fused polycyclic aromatic group consisting of up to 3 aromatic rings, s is 0 or 1, and z is an integer of 0 to 3.

The aromatic structure E is selected from benzene rings and fused polycyclic aromatic group consisting of up to 3 aromatic rings, such as benzene, naphthalene, anthracene, and phenanthrene rings. D is a single bond or a $C_1$-$C_{10}$ divalent organic group in which a carbon atom may be replaced by an oxygen atom.

Preferred examples of the unit having formula (14) are shown below, with the sulfonium cation being excluded therefrom. The cation moiety used herein may be selected from the preferred cation examples listed above for formula (1).

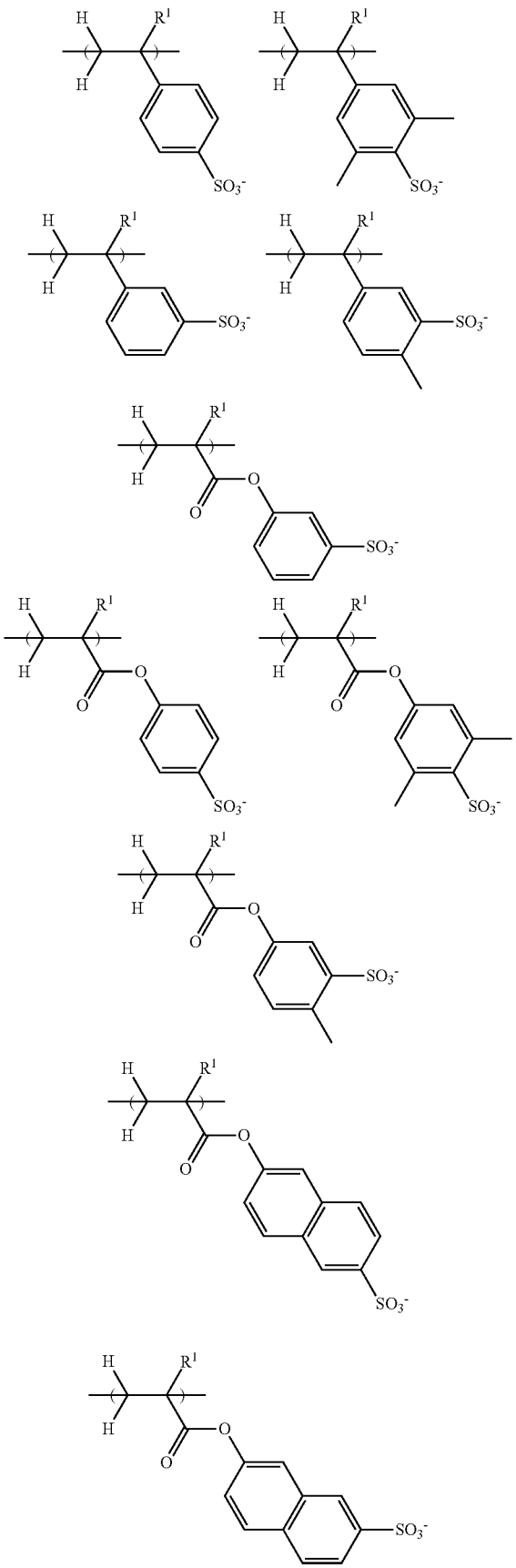

-continued

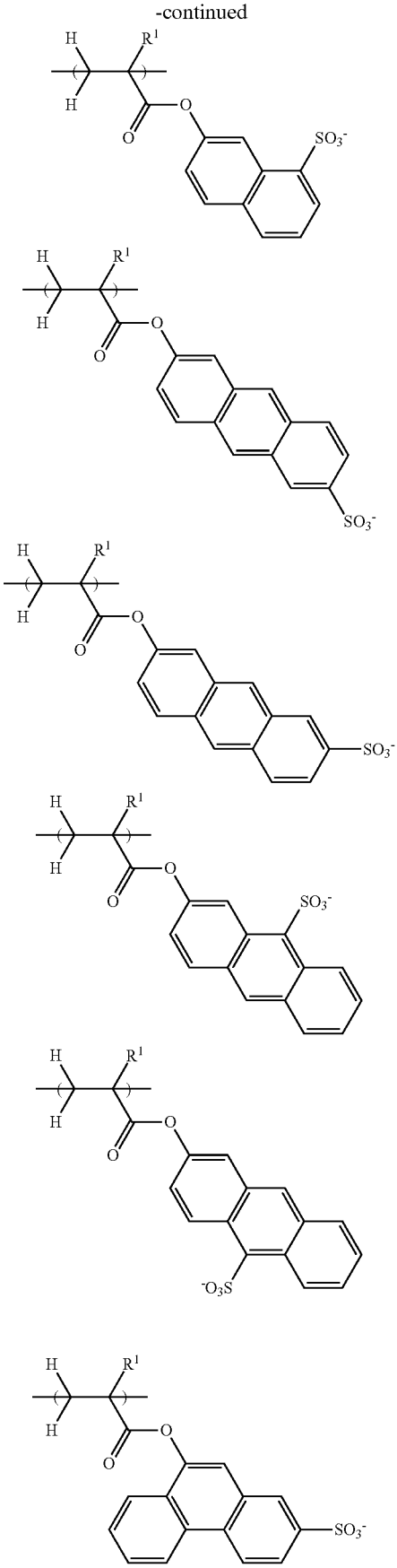

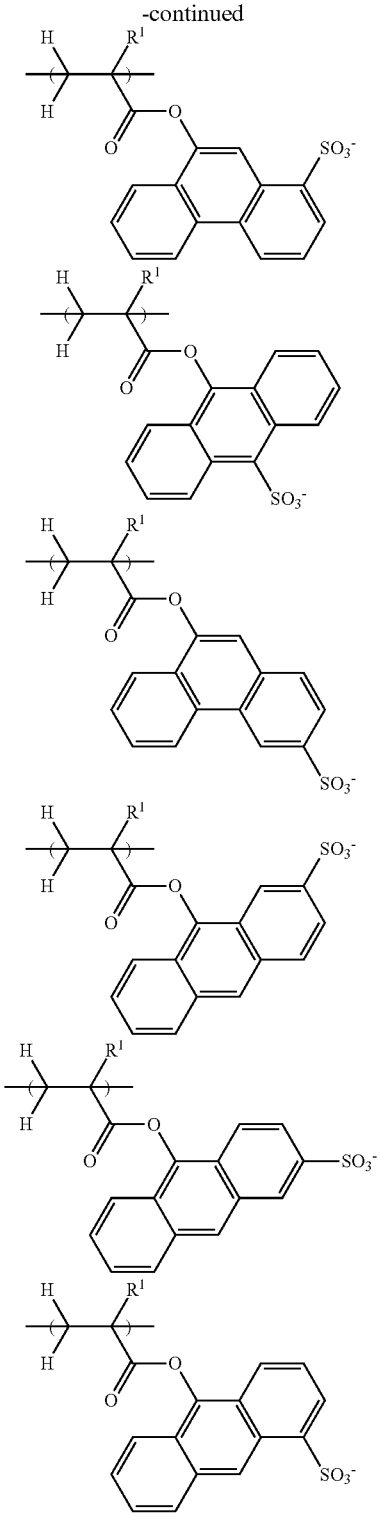

Herein R[1] is as defined above.

The polymer comprising recurring units (14) may preferably be designed like the first polymer comprising recurring units (1) before it is added to the resist composition. The upper limit of the proportion of units (14) is preferably set lower than that for units (1). Specifically the polymer comprising recurring units (14) is designed such that the proportion of units (14) is from 0.5 mol % to 5 mol % based on the entire recurring units of the polymer comprising recurring units (14), and does not surpass the molar ratio of recurring units (1) present in the overall resist composition, preferably accounts for at most one half of the molar ratio of recurring units (1) present in the overall resist composition. The design frees the polymer from the problem of solvent solubility. If the proportion of units (14) is below 0.5 mol %, the sufficient addition effect may not be achieved.

The resist composition is generally obtained by adding a solvent to the polymer(s). If desired, a basic compound, surfactant, dissolution inhibitor (detail being omitted) and the like may be added.

For a chemically amplified resist composition comprising a polymer to which an acid generating unit is not bound, the basic compound is, in fact, an essential component. Also in the resist composition of the invention, a basic compound is preferably added to provide a high resolution and for adjustment to an adequate sensitivity. The basic compound is preferably added in an amount of 0.01 to 5 parts, more preferably 0.05 to 3 parts by weight per 100 parts by weight of the overall polymers. A number of basic compounds are known in the art, for example, from Patent Documents 1 to 5. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, carbamate derivatives, and ammonium salts. Numerous examples of these basic compounds are described in Patent Documents 1 and 4. Generally any of these basic compounds may be used. Two or more may be selected from these basic compounds and used in admixture.

Examples of the basic compound which is preferably compounded herein include tris(2-(methoxymethoxy)ethyl)amine, tris(2-(methoxymethoxy)ethyl)amine N-oxide, morpholine derivatives, and imidazole derivatives.

An amine is effective when a resist pattern is formed on a substrate, typically a substrate having a surface layer of chromium compound, which is susceptible to a phenomenon that the resist film becomes substantially insoluble at the substrate interface during pattern formation, known as a footing phenomenon. Specifically, an amine compound or amine oxide compound having a carboxyl group, but free of hydrogen in covalent bond with nitrogen serving as basic center (exclusive of those amine and amine oxide compounds whose nitrogen atom is contained in the cyclic structure of aromatic ring) is effectively used for improving the pattern profile.

Preferred examples of the amine or amine oxide compound having a carboxyl group, but free of hydrogen in covalent bond with nitrogen serving as basic center include compounds of the general formulae (15) to (17), but are not limited thereto.

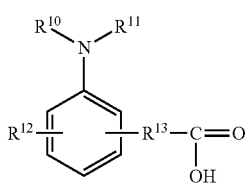

(15)

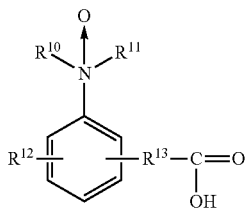

(16)

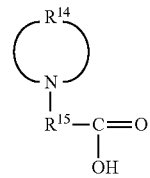

(17)

Herein $R^{10}$ and $R^{11}$ are each independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, or $C_1$-$C_{10}$ alkylthioalkyl group. $R^{10}$ and $R^{11}$ may bond together to form a ring with the nitrogen atom to which they are attached. $R^{12}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, $C_1$-$C_{10}$ alkylthioalkyl group, or halogen. $R^{13}$ is a single bond, a straight, branched or cyclic $C_1$-$C_{20}$ alkylene group, or $C_6$-$C_{20}$ arylene group. $R^{14}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{15}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_2$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and isomers of their alkyl moiety. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_1$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (15) include, but are not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalenic acid, 3-diethylamino-2-naphthalenic acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Preferred examples of the amine oxide compound of formula (16) include oxidized forms of exemplary amine compounds of formula (15), but are not limited thereto.

Preferred examples of the amine compound of formula (17) include, but are not limited thereto, 1-piperidinepropionic acid, 1-piperidinebutyric acid, 1-piperidinemalic acid, 1-piperidinepyruvic acid, and 1-piperidinelactic acid.

The compounds having an amine oxide structure represented by formula (16) may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. Reference is made to JP-A 2010-164933.

This reaction is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization. Reference is made to JP-A 2008-102383.

To the resist composition, any of surfactants commonly used for improving coating characteristics may be added. A number of surfactants are well known and described in Patent Documents 1 to 5 and any suitable one may be selected therefrom. Also, fluorinated polymers as disclosed in Patent Document 12 may be added.

In the resist composition, the surfactant is preferably formulated in an amount of up to 2 parts, and more preferably up to 1 part by weight, per 100 parts by weight of the overall polymer. When used, the surfactant is preferably added in an amount of at least 0.01 part by weight.

The organic solvent used in the preparation of the resist composition may be any of organic solvents in which the polymer(s), acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the negative resist composition, the organic solvent is preferably used in an amount of 1,000 to 10,000 parts by weight, more preferably 2,000 to 9,700 parts by weight per 100 parts by weight of the overall polymers. When adjusted to such a concentration, the resist composition is applicable by a spin coating technique to form a resist film having a thickness of 10 to 200 nm and an improved flatness in a consistent manner.

Process

Pattern formation using the resist composition of the invention may be performed by well-known lithography processes. The process generally involves coating, prebaking, exposure to EB or EUV, PEB, and development with alkaline developer. The resist composition is first applied onto a substrate for IC fabrication (silicon wafer having a surface layer of Si, $SiO_2$, SiN, SiON, TiN, WSi, BPSG, SOG, organic antireflective coating or the like) or a substrate for mask circuit fabrication (quartz substrate having a surface layer of Cr, CrO, CrON, MoSi or the like) by a suitable coating technique such as spin coating. The coating is prebaked on a hot plate at a temperature of 60 to 150° C. for 1 to 10 minutes, preferably 80 to 140° C. for 1 to 5 minutes to form a resist film of 0.05 to 2.0 μm thick.

Then the resist film is exposed to high-energy radiation, typically DUV, EUV, excimer laser or x-ray through a mask having a desired pattern. Alternatively, a pattern is written on the resist film directly with EB. The exposure dose is preferably 1 to 200 mJ/cm$^2$, more preferably 10 to 100 mJ/cm$^2$. The exposure may be performed by conventional lithography whereas the immersion lithography of holding a liquid between the mask and the resist film may be employed if desired. In this case, a protective film which is insoluble in water may be applied on the resist film. The resist film is then baked (PEB) on a hot plate at 60 to 150° C. for 1 to 5 minutes, preferably 80 to 140° C. for 1 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

One advantage is that the resist film has high etch resistance. Also the resist composition is effective when it is required that the pattern experience a minimal change of line width even when the duration between exposure and PEB is prolonged. Because of these advantages, the resist composition is effective in processing a photomask blank by EB lithography. The resist composition is effectively applicable to a processable substrate, specifically a substrate having a surface layer of material to which a resist film is less adherent and which is likely to invite pattern stripping or pattern collapse, and particularly a substrate having sputter deposited thereon a surface layer material susceptible to pattern collapse, typically metallic chromium or a chromium compound containing at least one light element selected from oxygen, nitrogen and carbon. Substrates of this nature are often used in photomask blanks, and the invention is effective for pattern formation on these substrates.

EXAMPLE

Synthesis Examples, Examples, and Comparative Examples are given below by way of illustration and not by way of limitation. The average molecular weights including Mw and Mn are determined by GPC versus polystyrene standards, from which a dispersity (Mw/Mn) is computed. Me stands for methyl. The compositional ratio of a copolymer is on a molar basis.

Polymer Synthesis Example 1

In a 200-mL dropping funnel under nitrogen blanket, a solution was prepared by dissolving 57.66 g of 4-(1-ethoxyethoxy)styrene, 6.52 g of acenaphthylene, 8.61 g of 4-methylstyrene, 7.21 g of a monomer Z-1 of the structure shown below, and 7.89 g of dimethyl 2,2'-azobis(2-methyl-propionate) (V601, Wako Pure Chemical Industries, Ltd.) in 90 g of methyl ethyl ketone (MEK) as a solvent. A 500-mL polymerization flask was purged with nitrogen, charged with 59 g of MEK, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature, combined with 60 g of methanol and 1.6 g of oxalic acid dihydrate, and stirred for 4 hours at 50° C. The solution was cooled down to room temperature and then neutralized by adding 2.1 g of triethylamine. The reaction solution was concentrated. The concentrate was dissolved in 120 g of THF again and added dropwise to 1,000 g of hexane whereupon a copolymer precipitated. The copolymer precipitate was collected by filtration and washed twice with 300 g of hexane. After washing, the copolymer was dissolved in 230 g of ethyl acetate and 90 g of water. The resulting two-layer liquid was transferred to a separatory funnel where 0.48 g of acetic acid was added and separatory operation was carried out. The lower layer was discharged, 90 g of water and 0.67 g of pyridine were added to the remaining organic layer, and separatory operation was carried out. Further separatory operation of discharging the lower layer and adding 90 g of water was repeated four times. Thereafter, the organic layer, ethyl acetate was concentrated and dissolved in 100 g of acetone. The acetone solution was added dropwise to 2 L of water whereupon a copolymer precipitated. The polymer precipitate was collected by filtration, washed twice with 1 L of water, and dried for 24 hours at 50° C., yielding 50 g of a copolymer, designated Polymer 1, having Mw=4,610 and Mw/Mn=1.52.

Polymer 1

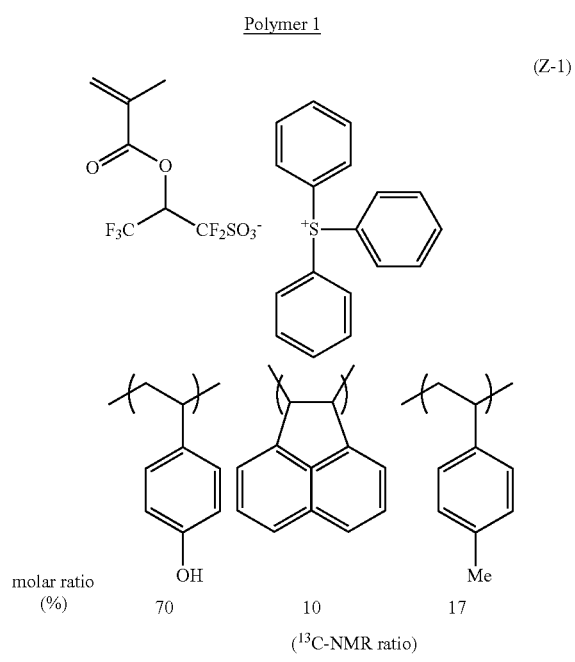

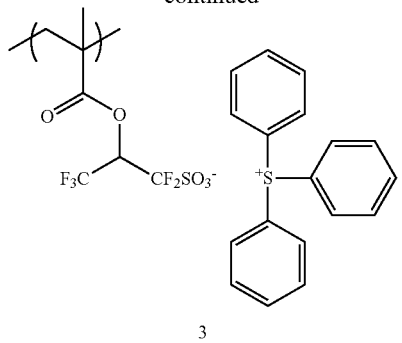

Polymer Synthesis Example 2

In a 200-mL dropping funnel under nitrogen blanket, a solution was prepared by dissolving 55.98 g of 4-(1-ethoxyethoxy)styrene, 4.86 g of acenaphthylene, 2.64 g of 4-methylstyrene, 6.71 g of monomer Z-1 of the above structure, 8.69 g of a monomer Y-1 of the structure shown below, and 7.17 g of dimethyl 2,2'-azobis(2-methylpropionate) (V601, Wako Pure Chemical Industries, Ltd.) in 90 g of methyl ethyl ketone (MEK) as a solvent. A 500-mL polymerization flask was purged with nitrogen, charged with 59 g of MEK, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature, combined with 60 g of methanol and 1.6 g of oxalic acid dihydrate, and stirred for 4 hours at 50° C. The solution was cooled down to room temperature and then neutralized by adding 2.1 g of triethylamine. The reaction solution was concentrated, dissolved in 120 g of THF again, and added dropwise to 1,000 g of hexane whereupon a copolymer precipitated. The copolymer precipitate was collected by filtration and washed twice with 300 g of hexane. After washing, the copolymer was dissolved in 230 g of ethyl acetate and 90 g of water. The resulting two-layer liquid was transferred to a separatory funnel where separatory operation was carried out. Subsequently, separatory operation of discharging the lower layer and adding 90 g of water to the remaining organic layer was repeated four times. Thereafter, the organic layer, ethyl acetate was concentrated and dissolved in 100 g of acetone. The acetone solution was added dropwise to 2 L of water whereupon a copolymer precipitated. The polymer precipitate was collected by filtration, washed twice with 1 L of water, and dried for 24 hours at 50° C., yielding 50 g of a copolymer, designated Polymer 2, having Mw=4,750 and Mw/Mn=1.60.

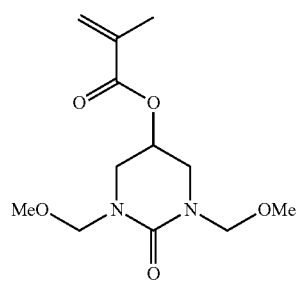

(Y-1)

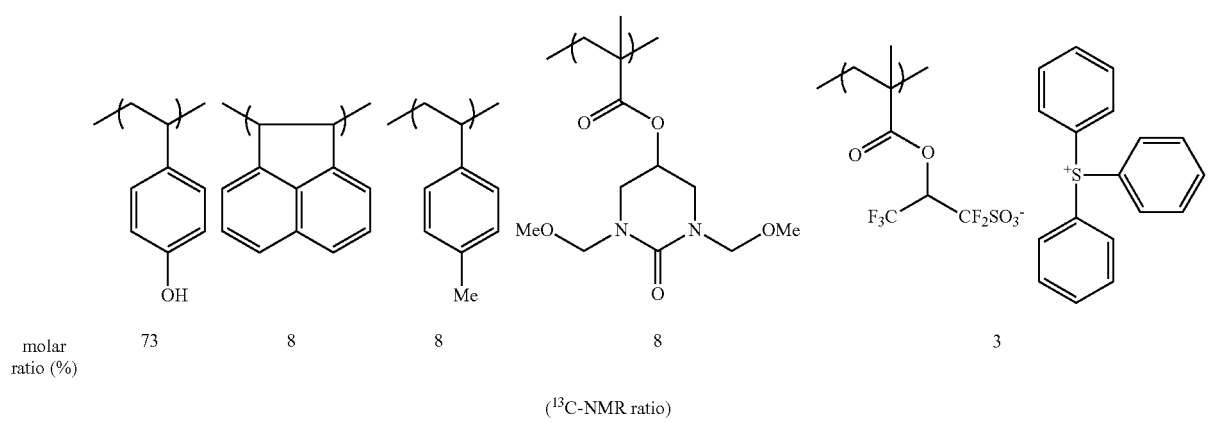

Polymer 2 molar ratio (%)    73    8    8    8    3

($^{13}$C-NMR ratio)

Polymer Synthesis Example 3

In a 200-mL dropping funnel under nitrogen blanket, a solution was prepared by dissolving 56.19 g of 4-hydroquinone monomethacrylate, 8.24 g of acenaphthylene, 7.99 g of 4-methylstyrene, 7.58 g of monomer Z-1 of the above structure, and 8.31 g of dimethyl 2,2'-azobis(2-methylpropionate) (V601, Wako Pure Chemical Industries, Ltd.) in 90 g of methyl ethyl ketone (MEK) as a solvent. A 300-mL polymerization flask was purged with nitrogen, charged with 59 g of MEK, and heated at 80° C., after which the solution was added dropwise to the flask over 4 hours. After the completion of dropwise addition, stirring was continued for 4 hours while maintaining the polymerization temperature of 80° C. Thereafter, the polymerization solution was cooled down to room temperature, and added dropwise to 1,300 g of hexane whereupon a copolymer precipitated. The copolymer precipitate was collected by filtration, washed twice with 300 g of hexane, and dissolved in 140 g of MEK. The MEK solution was passed through a nylon filter having a pore size of 0.02 μm and added dropwise to 1,300 g of hexane whereupon a copolymer precipitated. The copolymer precipitate was collected by filtration, washed twice with 300 g of hexane, and dried, yielding 75 g of a white copolymer, designated Polymer 7, having Mw=4,100 and Mw/Mn=1.59.

Polymer 7

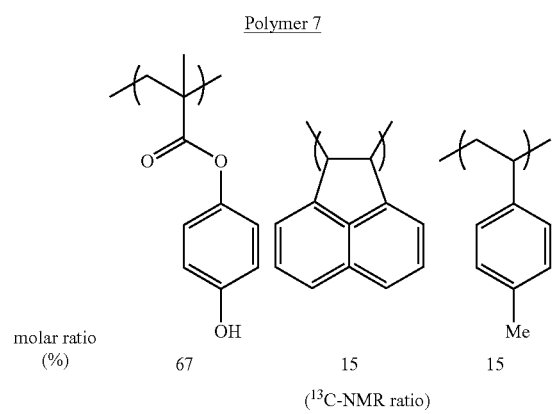

molar ratio (%)    67    15    15

($^{13}$C-NMR ratio)

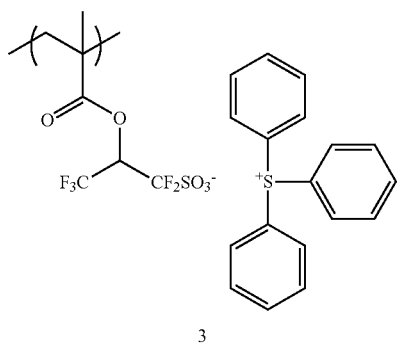

3

Polymer Synthesis Examples 4 to 13

Resins (Polymers 3 to 13) shown in Table 1 were synthesized by the same procedure as Polymer Synthesis Examples 1 to 3 except that the type and amount of monomers were changed. The units 1 to 4 in Table 1 have the structures shown in Tables 2 to 5. In Table 1, a ratio of each unit incorporated is on a molar basis.

TABLE 1

| Resin | Unit 1 (ratio) | Unit 2 (ratio) | Unit 3 (ratio) | Unit 4 (ratio) | Unit 5 (ratio) |
|---|---|---|---|---|---|
| Polymer 1 | A-1(0.70) | B-1(0.17) | C-2(0.10) | Z-1(0.03) | |
| Polymer 2 | A-1(0.73) | B-1(0.08) | C-2(0.08) | Z-1(0.03) | Y-1(0.08) |
| Polymer 3 | A-1(0.70) | B-1(0.17) | C-1(0.10) | Z-1(0.03) | |
| Polymer 4 | A-1(0.80) | B-1(0.10) | C-2(0.07) | Z-1(0.03) | |
| Polymer 5 | A-1(0.71) | B-1(0.16) | C-2(0.10) | Z-2(0.03) | |
| Polymer 6 | A-1(0.73) | B-1(0.14) | C-2(0.10) | Z-3(0.03) | |
| Polymer 7 | A-2(0.67) | B-1(0.15) | C-2(0.15) | Z-1(0.03) | |
| Polymer 8 | A-2(0.67) | B-1(0.10) | C-2(0.12) | Z-1(0.03) | Y-1(0.08) |
| Polymer 9 | A-3(0.80) | B-1(0.10) | C-2(0.07) | Z-1(0.03) | |
| Polymer 10 | A-3(0.80) | B-1(0.05) | C-2(0.04) | Z-1(0.03) | Y-1(0.08) |
| Polymer 11 | A-1(0.70) | B-2(0.17) | C-2(0.10) | Z-1(0.03) | |
| Polymer 12 | A-1(0.70) | B-3(0.17) | C-2(0.10) | Z-1(0.03) | |
| Polymer 13 | A-1(0.70) | B-4(0.17) | C-2(0.10) | Z-1(0.03) | |

TABLE 2

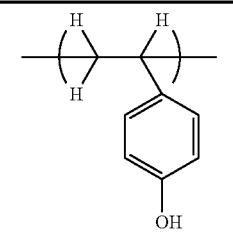

A-1

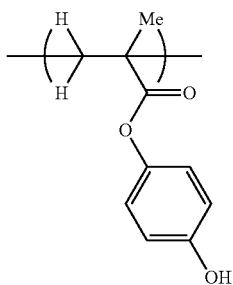

A-2

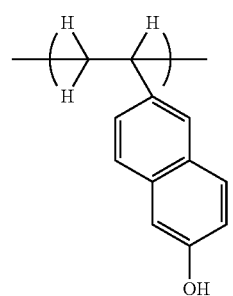

A-3

TABLE 3

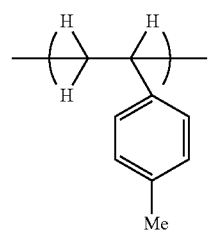

B-1

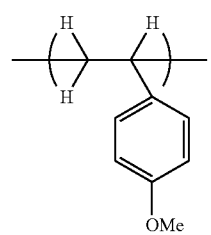

B-2

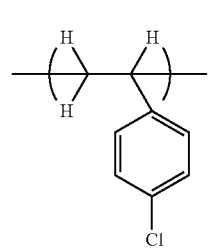

B-3

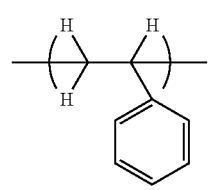

B-4

TABLE 4

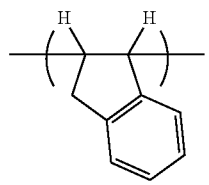

C-1

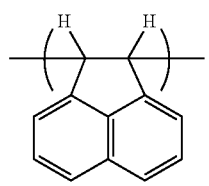

C-2

TABLE 5

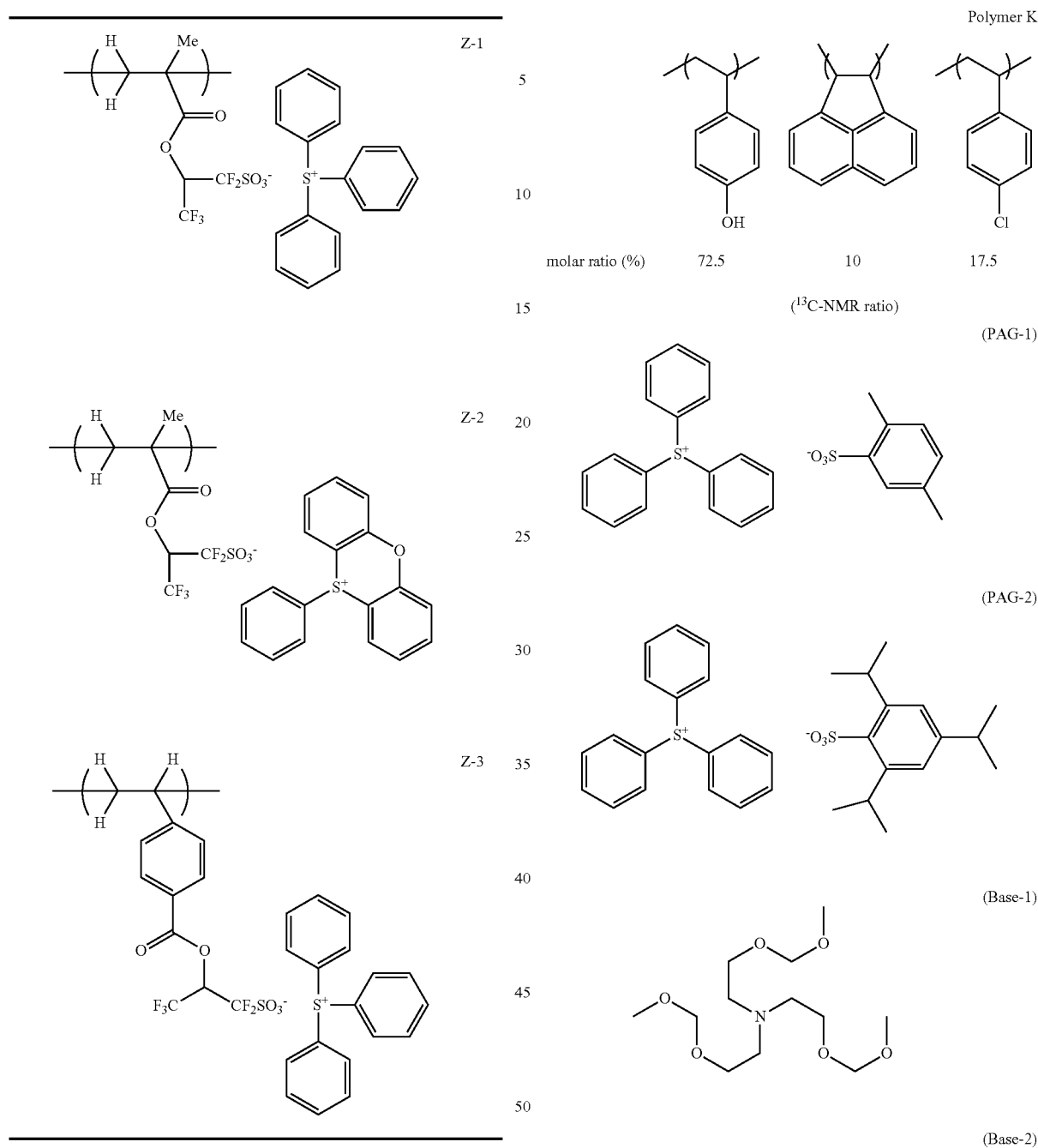

Examples 1 to 15 and Comparative Example 1

Preparation of Negative Resist Compositions

Resist compositions were prepared by using inventive polymers (Polymers 1 to 13) or comparative polymer (Polymer K), and dissolving the polymer, an acid generator (PAG-1 or 2), and a basic compound (Base-1 or 2) in an organic solvent mixture in accordance with the recipe shown in Table 6. These compositions were each filtered through a Teflon® filter having a pore size of 0.2 μm, thereby giving negative resist composition solutions.

The organic solvents used were propylene glycol monomethyl ether acetate (PGMEA) and ethyl lactate (EL). Each solution further contained tetramethoxymethylglycoluril (TMGU) as a crosslinker and 0.075 pbw of a surfactant PF-636 (Omnova Solutions, Inc.).

TABLE 6

| | Resin (pbw) | PAG (pbw) | Base (pbw) | Additive (pbw) | Solvent 1 (pbw) | Solvent 2 (pbw) |
|---|---|---|---|---|---|---|
| Example 1 | Polymer 1 (80) | | Base-1 (0.7) | TMGU (8.154) | PGMEA (1,109) | EL (2,587) |
| Example 2 | Polymer 1 (40) Polymer K (40) | | Base-1 (0.4) | TMGU (8.154) | PGMEA (1,109) | EL (2,587) |
| Example 3 | Polymer 1 (80) | | Base-1 (55) Base-2 (0.15) | TMGU (8.154) | PGMEA (1,109) | EL (2,587) |
| Example 4 | Polymer 2 (80) | | Base-1 (0.7) | | PGMEA (1,109) | EL (2,587) |
| Example 5 | Polymer 3 (80) | | Base-1 (0.7) | TMGU (8.154) | PGMEA (1,109) | EL (2,587) |
| Example 6 | Polymer 4 (80) | | Base-1 (0.6) | TMGU (8.154) | PGMEA (1,109) | EL (2,587) |
| Example 7 | Polymer 5 (80) | | Base-1 (0.7) | TMGU (8.154) | PGMEA (1,109) | EL (2,587) |
| Example 8 | Polymer 6 (80) | | Base-1 (0.7) | TMGU (8.154) | PGMEA (1,109) | EL (2,587) |
| Example 9 | Polymer 7 (80) | | Base-1 (0.7) | TMGU (8.154) | PGMEA (1,109) | EL (2,587) |
| Example 10 | Polymer 8 (80) | | Base-1 (0.7) | | PGMEA (1,109) | EL (2,587) |
| Example 11 | Polymer 9 (80) | | Base-1 (0.7) | TMGU (8.154) | PGMEA (1,109) | EL (2,587) |
| Example 12 | Polymer 10 (80) | | Base-1 (0.7) | | PGMEA (1,109) | EL (2,587) |
| Example 13 | Polymer 11 (80) | | Base-1 (0.7) | TMGU (8.154) | PGMEA (1,109) | EL (2,587) |
| Example 14 | Polymer 12 (80) | | Base-1 (0.7) | TMGU (8.154) | PGMEA (1,109) | EL (2,587) |
| Example 15 | Polymer 13 (80) | | Base-1 (0.7) | TMGU (8.154) | PGMEA (1,109) | EL (2,587) |
| Comparative Example 1 | Polymer K (80) | PAG-1 (8) PAG-2 (2) | Base-1 (0.7) | TMGU (8.154) | PGMEA (1,109) | EL (2,587) |

*pbw: parts by weight

Evaluation of EB Image Writing

Using a coater/developer system ACT-M (Tokyo Electron Ltd.), each of the negative resist compositions (Examples 1 to 15, Comparative Example 1) was spin-coated onto a 152-mm square mask blank having a chromium oxynitride film at the outermost surface and pre-baked on a hot plate at 110° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to EB using an EB writer system EBM-5000Plus (NuFlare Technology Inc., accelerating voltage 50 keV), then baked (PEB) at 120° C. for 600 seconds, and developed with a 2.38 wt % tetramethylammonium hydroxide aqueous solution, thereby yielding negative patterns.

The patterned wafer was observed under a top-down scanning electron microscope (TDSEM). The optimum exposure (Eop) was defined as the exposure dose ($\mu C/cm^2$) which provided a 1:1 resolution at the top and bottom of a 200-nm 1:1 line-and-space pattern. The maximum resolution of the resist was defined as the minimum line width of a 400-nm line-and-space pattern that could be resolved and separated at the optimum exposure. The LER of a 200-nm line-and-space pattern was measured under SEM. On observation in cross section of the resist pattern under SEM, it was visually judged whether or not the pattern profile was rectangular. Table 7 tabulates the test results of the inventive and comparative resist compositions on EB image writing.

TABLE 7

| | Eop ($\mu C/cm^2$) | Maximum resolution (nm) | LER (nm) | Pattern profile |
|---|---|---|---|---|
| Example 1 | 20 | 40 | 4.3 | rectangular |
| Example 2 | 22 | 45 | 4.5 | rectangular |
| Example 3 | 21 | 40 | 4.4 | rectangular |
| Example 4 | 20 | 40 | 4.4 | rectangular |
| Example 5 | 21 | 45 | 4.6 | rectangular |
| Example 6 | 21 | 45 | 4.2 | rectangular |
| Example 7 | 20 | 40 | 4.3 | rectangular |
| Example 8 | 20 | 40 | 4.1 | rectangular |
| Example 9 | 20 | 40 | 4.5 | rectangular |
| Example 10 | 20 | 40 | 4.3 | rectangular |
| Example 11 | 21 | 40 | 4.1 | rectangular |
| Example 12 | 21 | 40 | 4.2 | rectangular |
| Example 13 | 19 | 40 | 4.4 | rectangular |
| Example 14 | 23 | 45 | 4.6 | rectangular |
| Example 15 | 22 | 45 | 4.5 | rectangular |
| Comparative Example 1 | 32 | 60 | 5.8 | undercut |

It is evident from Table 7 that the resist compositions of Examples are improved in resolution and LER over that of Comparative Example 1 when processed by EB lithography. The chemically amplified negative resist composition of the invention is suited as ultrafine pattern-forming material for VLSI fabrication and mask pattern-forming material by EB lithography.

Japanese Patent Application No. 2011-041517 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising a polymer, adapted such that the polymer may turn insoluble in alkaline developer by reacting with a crosslinker and/or a recurring unit having a crosslinkable functional group in the polymer under the catalysis of an acid generated upon exposure to high-energy radiation, to form crosslinks between polymer molecules, said polymer consisting of:

recurring units of the general formula (1), recurring units of at least one type selected from the general formulae (2), (3), and (4), recurring units of at least one type selected from the general formulae (5), (6), and (7), recurring units of the general formula (M-1) or (M-2), and recurring units of the general formula (11), (12) or (13):

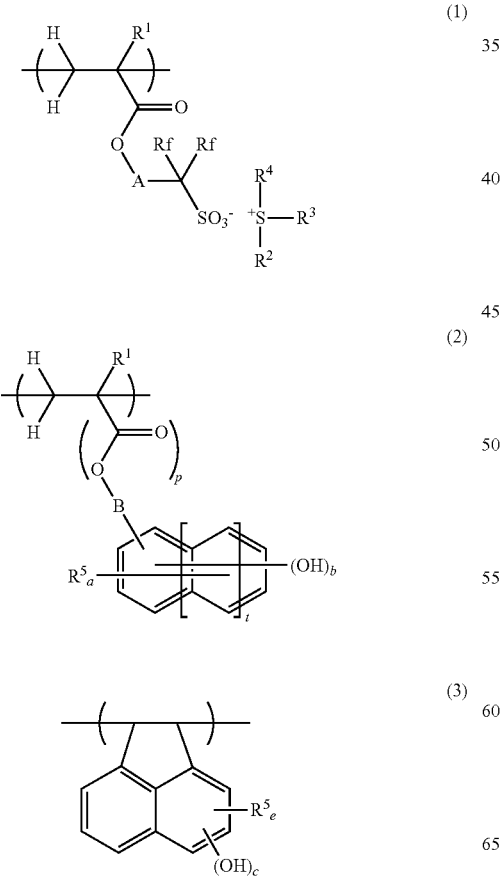

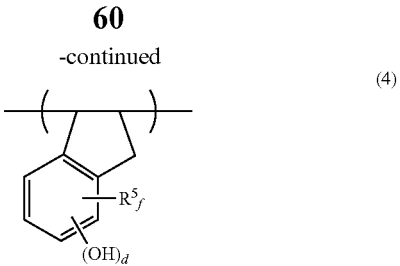

wherein A is a $C_1$-$C_{10}$ divalent hydrocarbon group in which some or all hydrogen atoms may be replaced by fluorine or a methylene moiety may be replaced by oxygen, Rf is each independently hydrogen, fluorine, trifluoromethyl, or pentafluoroethyl, with the proviso that not all Rf's are hydrogen, B is a single bond or a $C_1$-$C_{10}$ alkylene group which may be separated by ethereal oxygen, $R^1$ is hydrogen, fluorine, methyl, or trifluoromethyl, $R^2$, $R^3$, and $R^4$ are each independently a substituted or unsubstituted, straight or branched $C_1$-$C_{10}$ alkyl, alkenyl or oxoalkyl group, or a substituted or unsubstituted $C_6$-$C_{10}$ aryl, aralkyl or aryloxoalkyl group, any two or more of $R^2$, $R^3$, and $R^4$, taken together, may be a divalent organic group to form a ring with the sulfur atom, $R^5$ is each independently a $C_1$-$C_6$ alkyl group, a is an integer of 0 to 4, b is an integer of 1 to 5, c and d each are an integer of 1 to 4, e is an integer of 0 to (4-c), f is an integer of 0 to (4-d), p is independently 0 or 1, and t is an integer of 0 to 2,

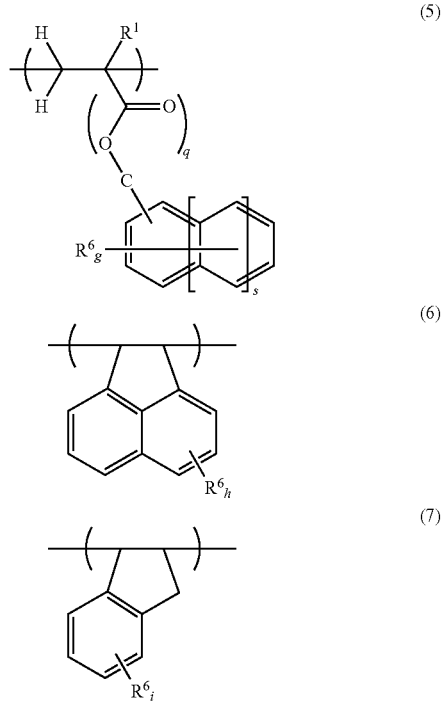

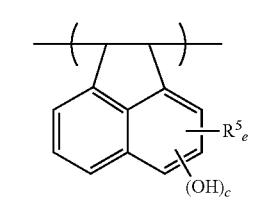

wherein C is a single bond or a $C_1$-$C_{10}$ alkylene group which may be separated by ethereal oxygen, $R^1$ is as defined above, $R^6$ is each independently halogen, an optionally halo-substituted $C_1$-$C_8$ alkyl or alkoxy group, a $C_6$-$C_{20}$ aromatic ring-containing hydrocarbon group, or an optionally halo-substituted $C_1$-$C_{12}$ acyloxy group, g is an integer of 0 to 5, h and i each are an integer of 0 to 4, q is 0 or 1, and s is an integer of 0 to 2,

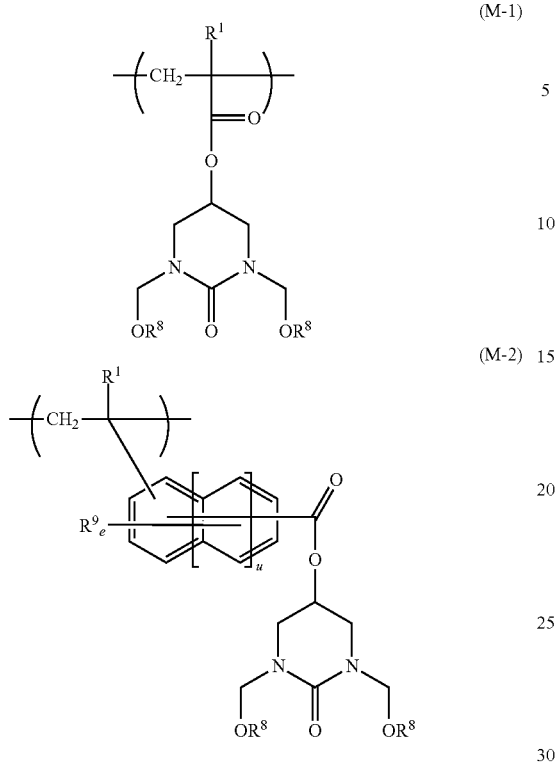

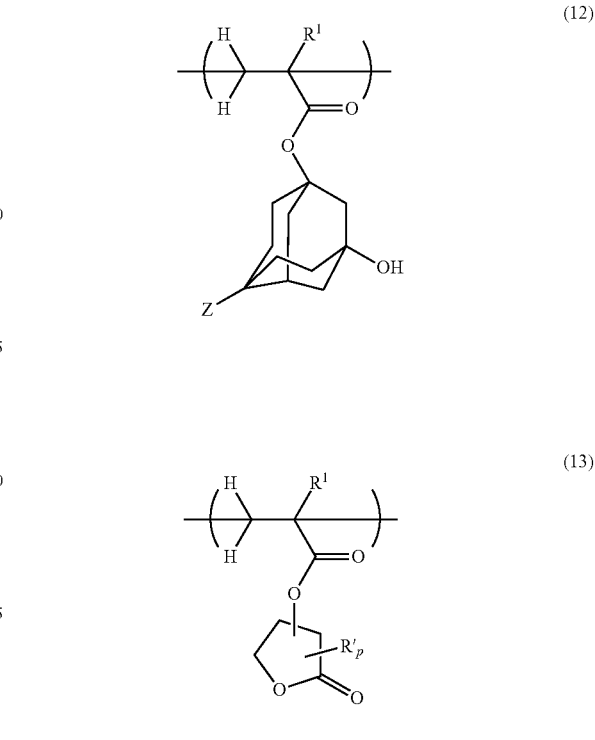

wherein $R^1$ is as defined above, $R^8$ is hydrogen or a straight, branched or cyclic $C_1$-$C_6$ monovalent hydrocarbon group, $R^9$ is each independently a straight, branched or cyclic $C_1$-$C_6$ monovalent hydrocarbon group which may contain oxygen, or halogen, e is an integer of 0 to 4, and u is an integer of 0 to 2,

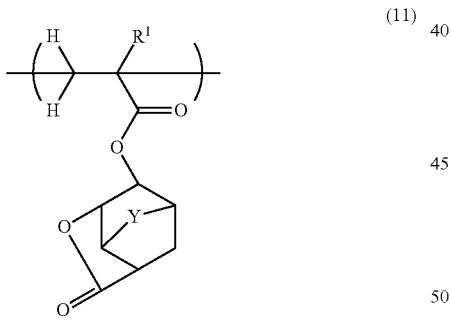

wherein $R^1$ is hydrogen, methyl or trifluoromethyl, Y is oxygen or methylene, Z is hydrogen or hydroxyl, R' is $C_1$-$C_4$ alkyl and p is an integer of 0 to 3, wherein the recurring units or formula (1) account for 0.5 to 10 mol %, the sum of recurring units of formulae (2), (3), and (4) accounts for 50 to 99.5 mol %, recurring units of formula (5), (6) or (7) account for up to 40 mol %, recurring units of formula (M-1) or (M-2) account for up to 20 mol %, and recurring units of formula (11), (12) or (13) account for up to 30 mol %, based on the entire recurring units of the polymer.

2. The resist composition of claim 1, further comprising a polymer free of recurring units of formula (1).

3. The resist composition of claim 1, further comprising a basic compound.

4. The resist composition of claim 1, wherein the crosslinker is an alkoxymethylglycoluril or alkoxymethylmelamine.

* * * * *